(12) United States Patent
Tanaka

(10) Patent No.: US 8,206,889 B2
(45) Date of Patent: Jun. 26, 2012

(54) MANUFACTURING METHOD OF SEMICONDUCTOR INTEGRATED CIRCUIT DEVICE

(75) Inventor: Toshihiko Tanaka, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 491 days.

(21) Appl. No.: 12/466,014

(22) Filed: May 14, 2009

(65) Prior Publication Data

US 2009/0297988 A1  Dec. 3, 2009

(30) Foreign Application Priority Data

May 29, 2008  (JP) .................. 2008-141328

(51) Int. Cl.
 G03F 7/00  (2006.01)
 G03F 7/20  (2006.01)
(52) U.S. Cl. .......... 430/270.1; 430/5; 430/311; 430/396
(58) Field of Classification Search ........... 430/5, 270.1, 430/311, 396
 See application file for complete search history.

(56) References Cited

U.S. PATENT DOCUMENTS

| 5,898,776 | A | * | 4/1999 | Apland et al. ............... 326/8 |
| 6,235,434 | B1 | * | 5/2001 | Sweeney et al. ............. 430/5 |
| 6,333,961 | B1 | * | 12/2001 | Murakami .................. 378/35 |
| 6,989,229 | B2 | * | 1/2006 | Lucas et al. ............... 430/311 |
| 7,741,616 | B2 |   | 6/2010 | Murakami |
| 7,842,438 | B2 | * | 11/2010 | Constancias ................ 430/5 |
| 2004/0188383 | A1 | * | 9/2004 | Lucas et al. ............... 216/54 |
| 2009/0257042 | A1 | * | 10/2009 | Komatsuda .................. 355/71 |
| 2010/0203432 | A1 | * | 8/2010 | Itoh ........................ 430/5 |
| 2010/0323280 | A1 | * | 12/2010 | Jeong ...................... 430/5 |
| 2011/0117479 | A1 | * | 5/2011 | Suga et al. ................ 430/5 |

FOREIGN PATENT DOCUMENTS

| CN | 1969372 | 5/2007 |
| JP | 2002-532738 | 10/2002 |
| WO | WO 00/34828 | 6/2000 |

OTHER PUBLICATIONS

Amano et al, "Study of EUVL mask defect repair using FIB-GAE method", Proc. of SPIE vol. 7122, 7122H (2008).*
Kamo et al, "EUVL practical mask structure with light shield area for 32nm half pitch and beyond", Proc. SPIE 7122, 71227 (2008).*
Kamo et al, "Thin-absorber extreme-ultraviolet lithography mask with light-shield border for full-field scanner:flatness and image placement change through mask process", J. Micro/Nanolith. MEMS MOEMS 9, 023005 (2010).*
Chinese Office Action, w/ English translation thereof, issued in Chinese Patent Application No. 200910139008.5, dated Feb. 14, 2012.

* cited by examiner

Primary Examiner — Amanda C. Walke
(74) Attorney, Agent, or Firm — McDermott Will & Emery LLP

(57) ABSTRACT

A manufacturing technique of a semiconductor integrated circuit device utilizing a defect correction technique of a reflection-type mask using extreme ultraviolet (EUV) light with a wavelength of about 13.5 nm as an exposure light source is provided. An auxiliary pattern having an opening diameter finer than that of an opening pattern in which a phase defect is generated is formed in an absorption layer in the vicinity of the opening pattern. The auxiliary pattern is a pattern for adjusting the exposure light amount at the time when the opening pattern is transferred to a photoresist film on a wafer.

12 Claims, 18 Drawing Sheets

MANUFACTURING METHOD OF SEMICONDUCTOR INTEGRATED CIRCUIT DEVICE

CROSS-REFERENCE TO RELATED APPLICATION

The present application claims priority from Japanese Patent Application No. JP 2008-141328 filed on May 29, 2008, the content of which is hereby incorporated by reference into this application.

TECHNICAL FIELD OF THE INVENTION

The present invention relates to a manufacturing technique of a semiconductor integrated circuit device including a lithography process using a reflection-type mask, and more particularly to a technique effectively applied to the manufacture of a semiconductor integrated circuit device utilizing a defect correction technique of a reflection-type mask using extreme ultraviolet (EUV) light with a wavelength of about 13.5 nm as exposure light.

BACKGROUND OF THE INVENTION

Semiconductor devices such as a semiconductor integrated circuit device and others are mass-produced by repeating a photolithography process of irradiating a mask, which is an original master on which a circuit pattern is drawn, with exposure light to transfer the circuit pattern onto a semiconductor wafer (hereinafter, simply referred to as a wafer) via a reduction optical system.

Recently, miniaturization of the semiconductor devices has been advanced, and a method of improving the resolution by further reducing the exposure wavelength of photolithography has been studied. More specifically, although ArF lithography using argon fluoride (ArF) excimer laser light with a wavelength of 193 nm as exposure light has been developed up until now, EUV lithography using EUV light with a wavelength of 13.5 nm which is far shorter than that described above is under development. Note that the EUV light is also referred to as a soft X-ray.

In the EUV lithography, a transmission-type mask cannot be used due to the relevance of light absorption of substances. Therefore, a multilayer reflective substrate utilizing reflection (Bragg reflection) by a multilayer film obtained by stacking, for example, an Mo (molybdenum) layer and an Si (silicon) layer is used as a mask blank of the EUV lithography. This multilayer film reflection is the reflection utilizing a kind of interference.

A reflection-type mask for EUV lithography is constituted of a multilayer film blank obtained by depositing the above-described multilayer film on a substrate made of quartz glass or low thermal expansion glass and a circuit pattern made of an adsorption layer formed on the multilayer film blank. This reflection-type mask is a mask utilizing Bragg reflection and the wavelength of exposure light thereof is as extremely short as 13.5 nm. Therefore, even when slight variation of about one severalth of the wavelength is caused in the film thickness of the multilayer film, a local difference of the reflectance is caused, and defects called phase defects are generated at the time of transfer. Therefore, the reflection-type mask for EUV lithography has a large difference in terms of quality regarding the transfer of defects when compared with a conventional transmission-type mask.

The wavelength range of the EUV light is considered to be 9 nm to 15 nm. However, since the reflectance of the reflection-type mask and the reflective lens optical system has to be ensured when the EUV light is applied to the lithography use, the above-described wavelength of 13.5 nm is mainly used. However, the wavelength is not limited to this wavelength. For example, the wavelengths of 9.5 nm and others have been studied, and the EUV light can be applied to the lithography use as long as the wavelength thereof is within the above-described range (9 nm to 15 nm).

Moreover, in the EUV lithography, even in the case where contamination with a minute film thickness of several nm adheres to the surface of the mask, the exposure light reflectance at that part is reduced, and the so-called contamination defects which cause resolution failure, insufficient transfer accuracy, exposure in-plane dimensional variation and others become problematic.

Examples of defects of the reflection-type mask for EUV lithography are shown in FIGS. 1A to 1C. The reference numeral 201 in the drawings denotes a substrate of the reflection-type mask, 202 denotes a reflective layer made of a multilayer film, 203 denotes an absorption layer, 204 denotes an opening pattern of the absorption layer, 205 denotes a black defect remainder, 210 denotes a particle, 211 denotes a phase defect, and 220 denotes contamination. Herein, FIG. 1A shows an example of a normal black defect, FIG. 1B shows an example of a phase defect, and FIG. 1C shows an example of a contamination defect, respectively.

In the above-described phase defect and contamination defect, the reflectance of the mask reflective surface is lowered, in other words, the exposure amount is decreased, and these defects belong to black defects as a category. More specifically, in the case where the phase defect 211 is present in the opening pattern 204 formed in the absorption layer 203 as shown in FIG. 2A, when the image transferred to a photoresist film 231 on a semiconductor wafer 230 is observed, the transferred pattern 233 of the defective part has a smaller opening compared with a normal transferred pattern 232 having no defect or the opening is crashed as shown in FIG. 2B. Moreover, as shown in FIG. 3 (cross sectional view of the line A-A of FIG. 2B), in the transferred pattern 233 of the defective part, the photoresist film 231 is not removed up to the bottom.

Conventionally, as a defect correction method for the case where a black defect remainder is generated inside an opening pattern, a method of radiating FIB (focused ion beam), EB (electron beam) or the like and a method of scraping off the defect by mechanical means using a needle or the like have been used. Moreover, as a defect correction method for the case where a phase defect or a contamination defect is generated inside an opening pattern, a method in which the absorption layer 203 in the periphery of the opening pattern 204 is removed by irradiation of FIB or EB or mechanical means using a needle to enlarge the area of the opening pattern 204 as shown in FIG. 4, thereby compensating the reduction of the exposure amount has been used.

Note that a defect correction technique of the reflection-type mask for EUV lithography is described in Japanese Unexamined Patent Application Publication (Kohyo) No. 2002-532738 (Patent Document 1).

SUMMARY OF THE INVENTION

The defect correction methods of the reflection-type mask which have been conventionally carried out have a problem that, when the type or the size of a defect cannot be specified, the enlarging amount of the area of the opening pattern cannot be also specified. For example, when a phase defect is present inside an opening pattern, whether the cause of the phase defect is a particle 210a having a size as shown in FIG. 5A or a particle 210b having a size as shown in FIG. 5B cannot be specified from the transferred result onto a photoresist film, and also, the position of the particle 210a or 210b cannot be also specified.

Therefore, in an actual defect correction process, the area of an opening pattern is enlarged little by little and the pattern is transferred onto a photoresist film and evaluated each time, and this operation has to be repeated until desired dimensional accuracy is obtained. In particular, since the EUV lithography is the exposure in vacuum and the use of a pellicle is difficult, moving the mask into and out of a projection exposure system is not preferred. Therefore, the operation of reciprocating the mask between a mask correction section and a transfer exposure section many times applies a large load, which is a large obstruction to carry out the defect correction operation.

An object of the present invention is to provide a defect correction technique suitable for a phase defect and a contamination defect of the reflection-type mask for EUV lithography.

Another object of the present invention is to provide a manufacturing technique of a semiconductor integrated circuit device utilizing the above-described defect correction technique.

The above and other objects and novel characteristics of the present invention will be apparent from the description of this specification and the accompanying drawings.

The typical ones of the inventions disclosed in this application will be briefly described as follows.

A manufacturing method of a semiconductor integrated circuit device according to the present invention comprises the steps of:

(a) preparing a semiconductor wafer having a photoresist film formed on its principal surface;

(b) disposing the semiconductor wafer on a wafer stage of a projection exposure system having a reflection-type optical system;

(c) supplying a reflection-type mask having a first pattern and a second pattern at a predetermined position of the projection exposure system, the first pattern being formed by a reflective layer which reflects light of a predetermined wavelength and an absorption layer which is formed on the reflective layer and absorbs the light of the predetermined wavelength, and the second pattern being formed by the reflective layer which reflects the light of the predetermined wavelength and the absorption layer which is formed on the reflective layer and absorbs the light of the predetermined wavelength; and (d) exposing the photoresist film of the semiconductor wafer to the light of the predetermined wavelength based on the first and second patterns of the reflection-type mask, wherein the absorption layer which forms the first pattern of the reflection-type mask includes: a first opening pattern which exposes the reflective layer and corresponds to the first pattern; and an auxiliary pattern which is formed in a periphery of the first opening pattern and is different from the first opening pattern, and the absorption layer which forms the second pattern of the reflection-type mask includes: a second opening pattern which exposes the reflective layer and corresponds to the second pattern; and no auxiliary pattern which is different from the second opening pattern and formed in a periphery of the second opening pattern.

The effects obtained by typical embodiments of the inventions disclosed in this application will be briefly described below.

A defect correction technique suitable for a phase defect and a contamination defect of a reflection-type mask for EUV lithography can be provided.

Furthermore, as a result, miniaturization of a semiconductor integrated circuit device can be advanced.

BRIEF DESCRIPTIONS OF THE DRAWINGS

DESCRIPTIONS OF THE PREFERRED EMBODIMENTS

Figure 1A:
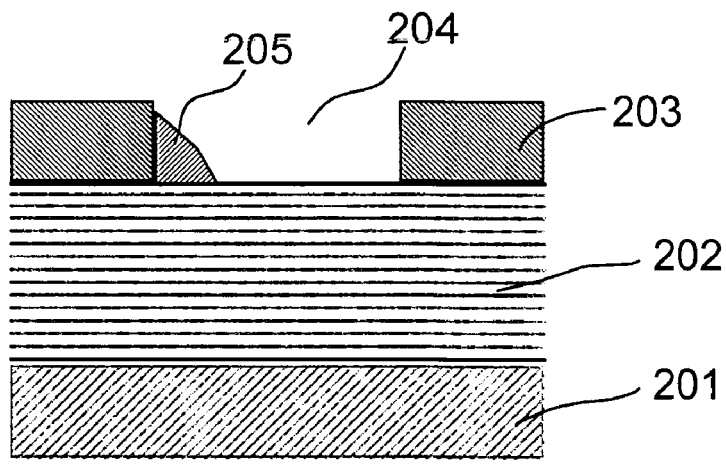
FIG. 1A is a cross sectional view showing an example of a defect of a reflection-type mask for EUV lithography.
Figure 1B:
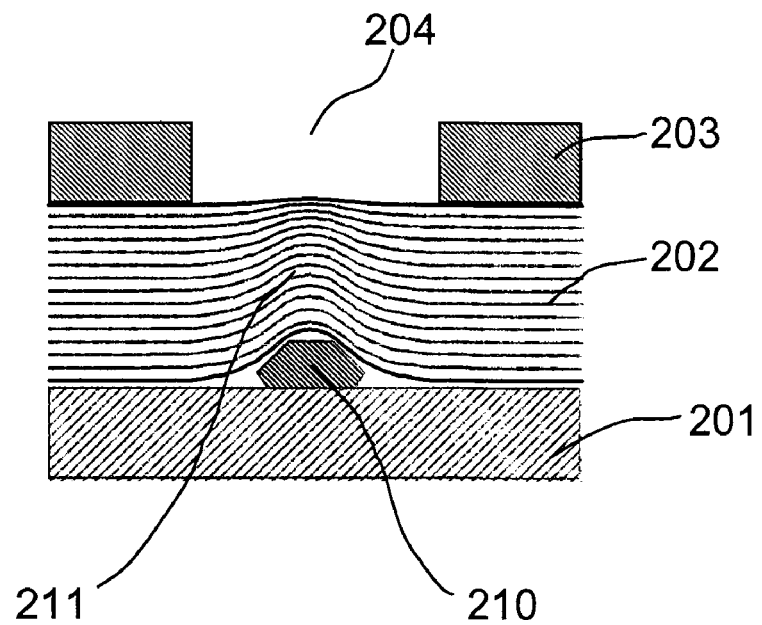
FIG. 1B is a cross sectional view showing an example of a defect of a reflection-type mask for EUV lithography.
Figure 1C:
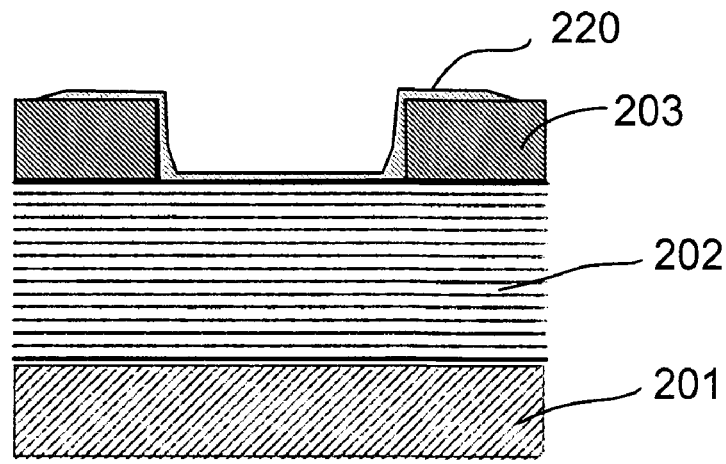
FIG. 1C is a cross sectional view showing an example of a defect of a reflection-type mask for EUV lithography.
Figure 2A:
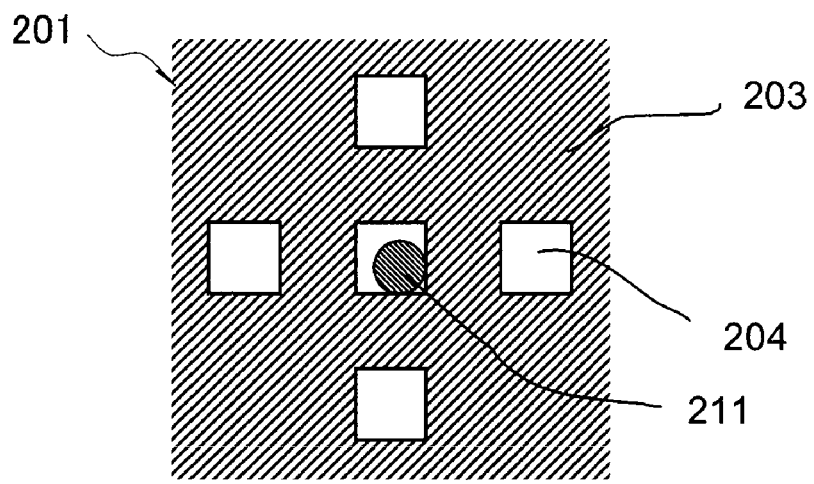
FIG. 2A is a plan view showing an example of a phase defect of the reflection-type mask for EUV lithography.
Figure 2B:
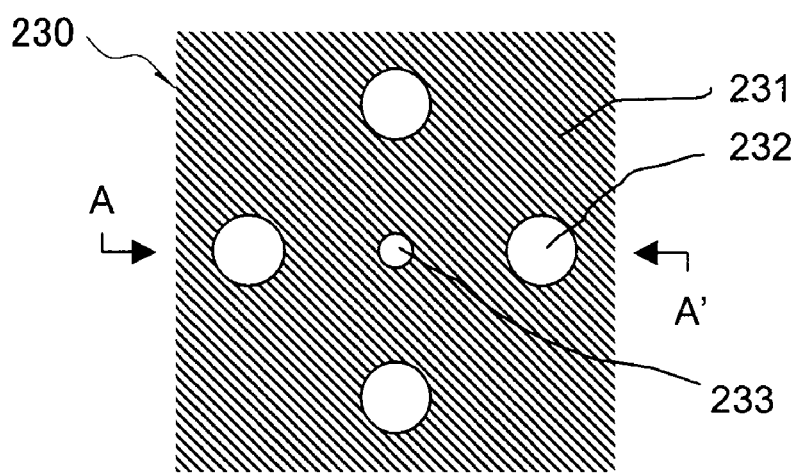
FIG. 2B is a plan view showing an image of the mask pattern shown in FIG. 2A transferred onto a photoresist film.
Figure 3:
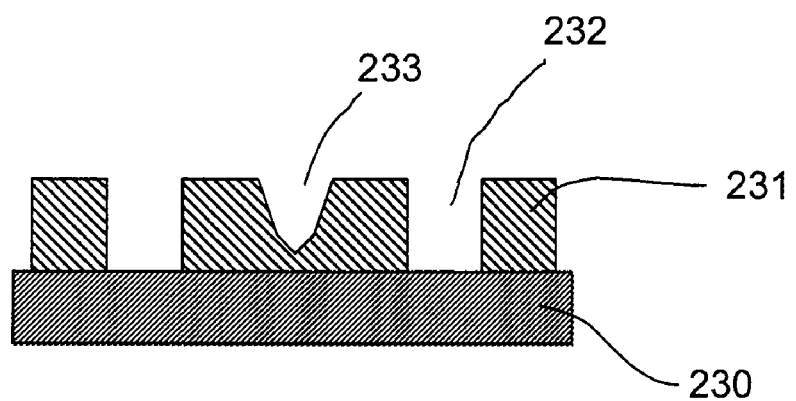
FIG. 3 is a cross sectional view of the line A-A of FIG. 2.
Figure 4:
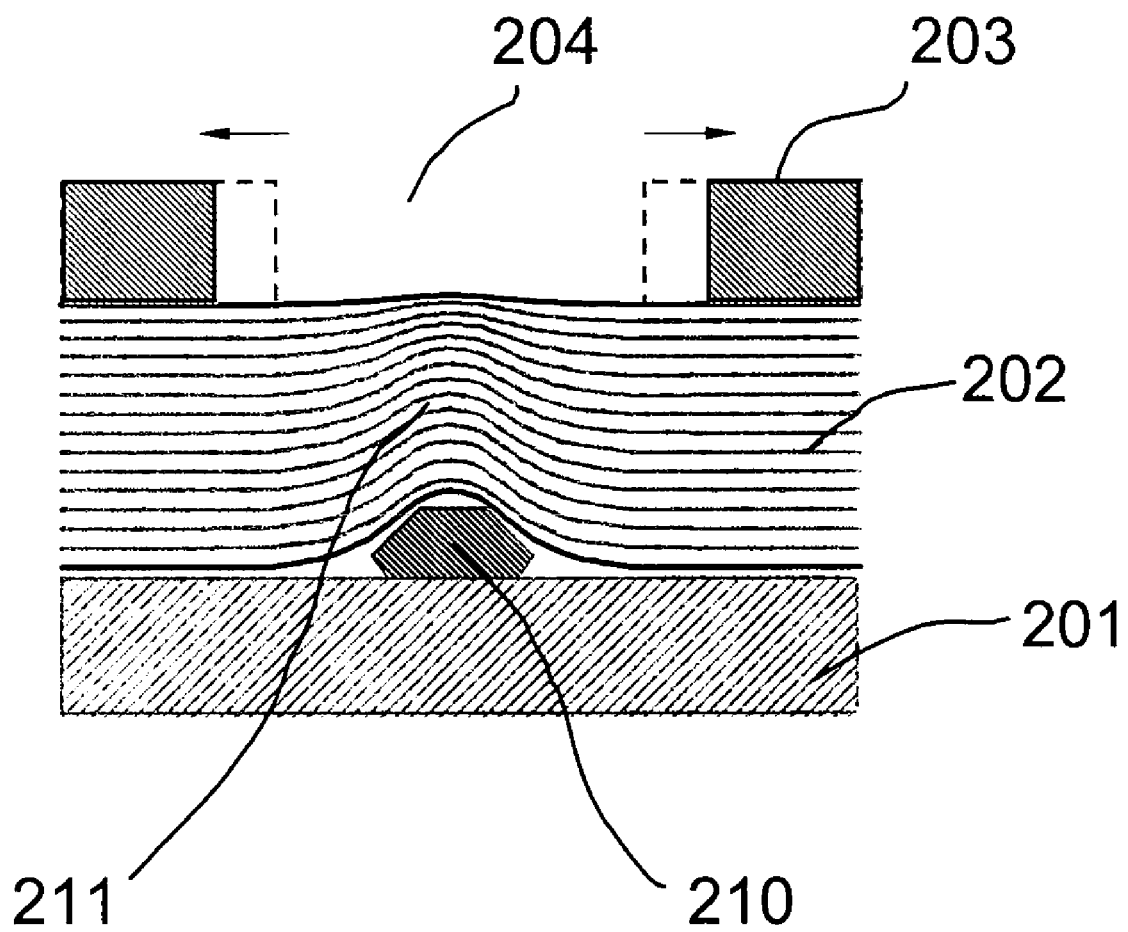
FIG. 4 is a cross sectional view showing a phase defect correction method of the reflection-type mask for EUV lithography which has been conventionally carried out.
Figure 5A:
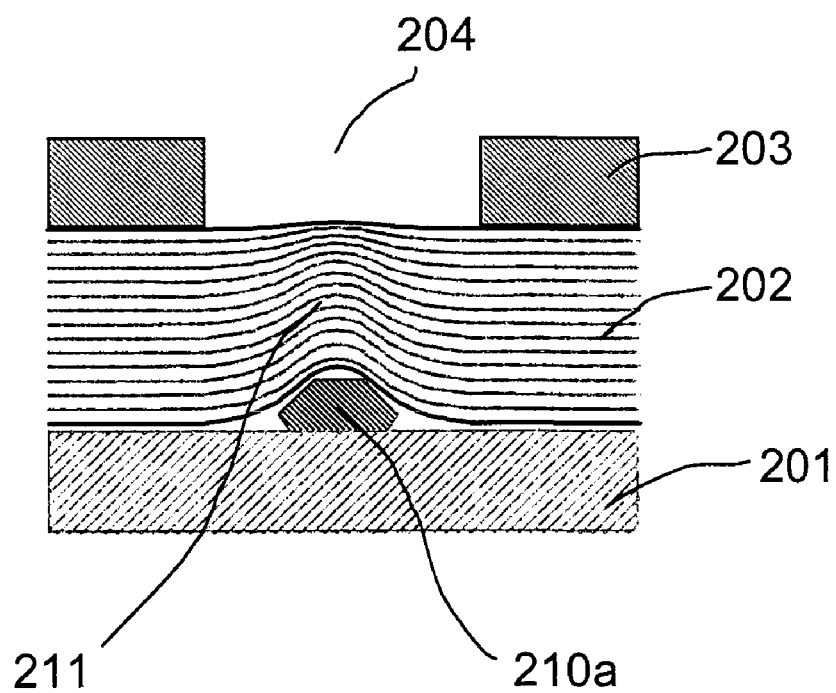
FIG. 5A is a cross sectional view showing an example of a phase defect of the reflection-type mask for EUV lithography.
Figure 5B:
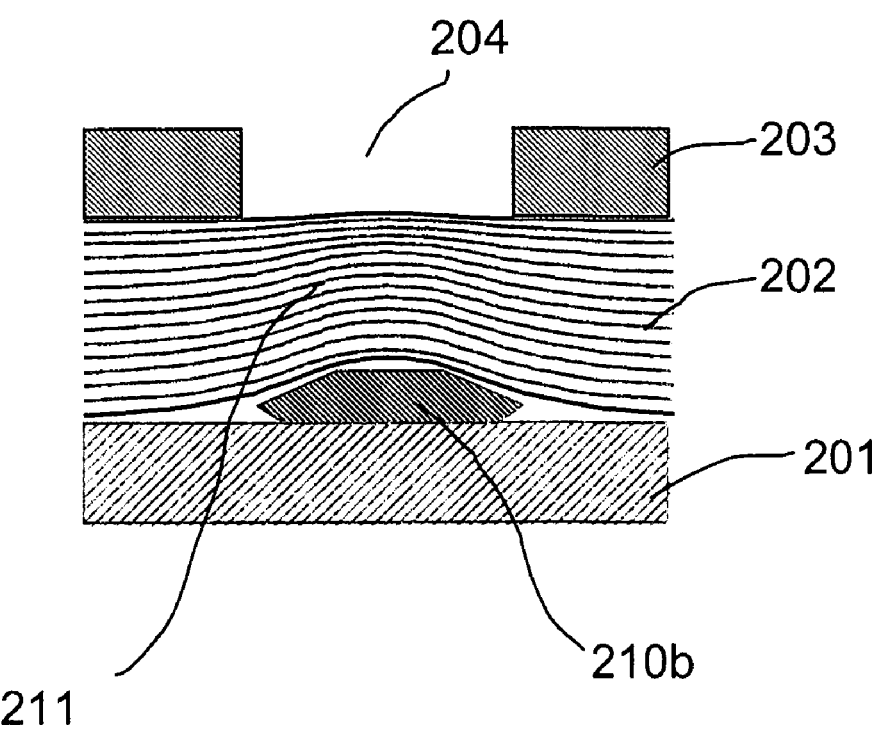
FIG. 5B is a cross sectional view showing an example of a phase defect of the reflection-type mask for EUV lithography.

Hereinafter, embodiments of the present invention will be described in detail with reference to the accompanying drawings. Note that components having the same function are denoted by the same reference numerals throughout the drawings for describing the embodiments, and the repetitive description thereof will be omitted. In addition, the description of the same or similar portions is not repeated in principle unless particularly required in the following embodiments. Also, in the drawings used to describe the following embodiments, hatching is used in some cases even in a plan view so as to make the drawings easy to see.

(First Embodiment)

First, characteristics of the EUV exposure will be described with reference to a schematic diagram of an EUV exposure apparatus shown in FIG. 6.

In the EUV lithography, exposure is carried out by an optical system called an off-telecentric optical system. The off-telecentric optical system is an optical system in which the exposure to a wafer is carried out not by a light beam perpendicular to a principal surface of the wafer, but by a light beam that is somewhat inclined thereto.

As shown in the drawing, a main part of the EUV exposure apparatus is composed of EUV light 1101, a reflection-type optical system 1102, a reflection-type mask 1103, an optical system box 1104, a reflection projection optical system 1105 and a wafer stage 1106. The direction of the EUV light 1101 with a wavelength of 13.5 nm which enters from an EUV light source (not shown) is changed by the reflection-type optical system 1102, and the EUV light irradiates the reflection-type mask 1103. The EUV light 1101 which has irradiated the reflection-type mask 1103 irradiates the wafer stage 1106 via the reflection projection optical system 1105 composed of a plurality of multilayer film mirrors. Then, through this EUV exposure, the pattern formed on the reflection-type mask 1103 forms an image on a wafer 1107 disposed on the wafer stage 1106.

The above-described exposure system including the reflection-type optical system 1102, the reflection-type mask 1103, and the refection projection optical system 1105 is enclosed in the optical system box 1104, and the interior thereof is evacuated so that the degree of vacuum thereof is particularly high compared with the surrounding area. This is in order to protect the reflection-type optical system 1102 from contamination. In addition, an opening 1108 is provided on the wafer stage 1106 side of the optical system box 1104. The reflection-type optical system 1102 has an optical system structure decentered from the central axes in order to prevent the reflective lenses from blocking the light beam. This is an arrangement to obtain a wide exposure field in the structure where all of the systems are reflective optical systems. Therefore, the EUV light 1101 enters the reflection-type mask 1103 with an inclination of about 5° to 6° with respect to a certain axis and forms an image by a light beam 1112 which is somewhat inclined with respect to the principal surface of the wafer 1107 disposed on the wafer stage 1106.

Figure 7:
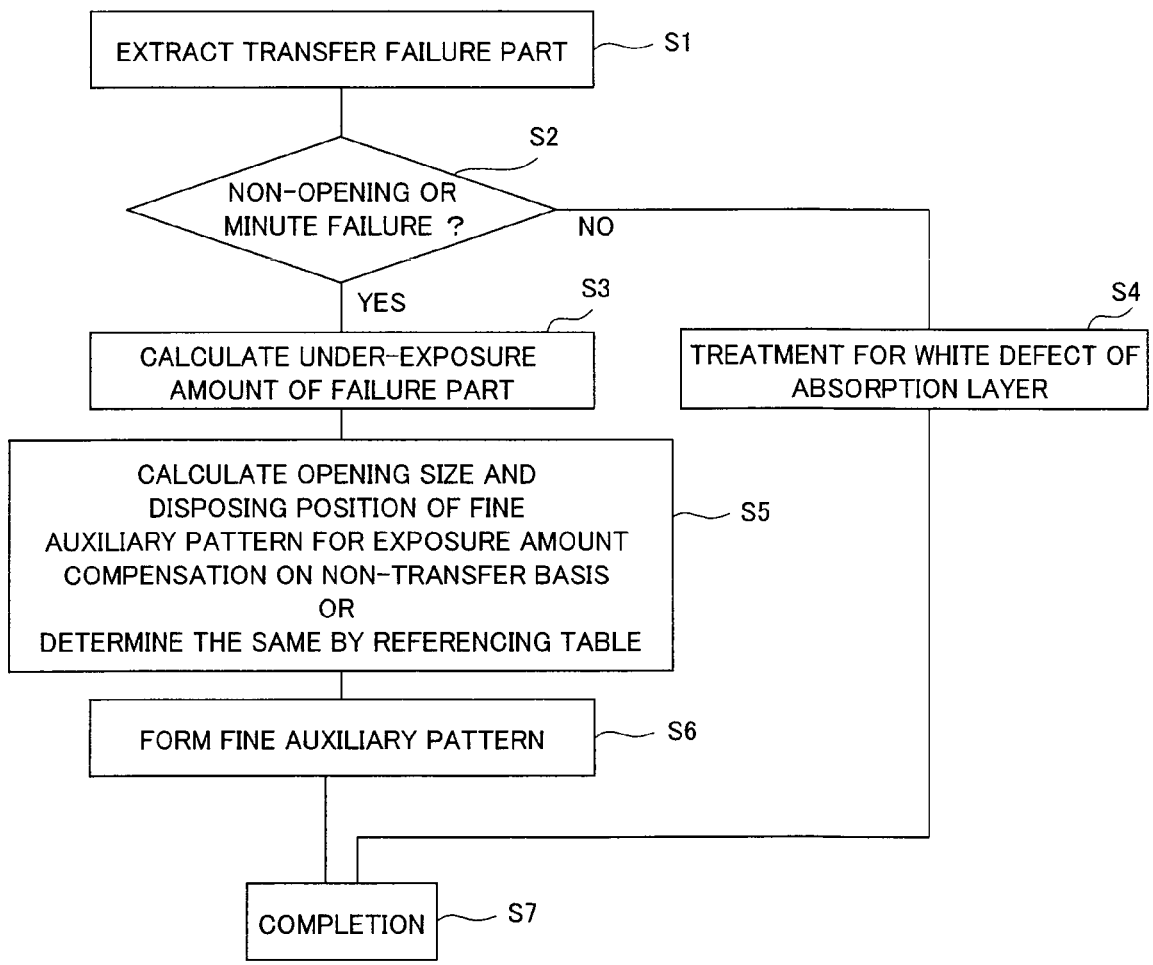
FIG. 7 is a flow chart describing a defect correction method of a reflection-type mask according to an embodiment of the present invention in the order of processes.

Next, a defect correction method of a reflection-type mask according to the present embodiment will be described in the order of processes with reference to FIG. 7.

Figure 6:
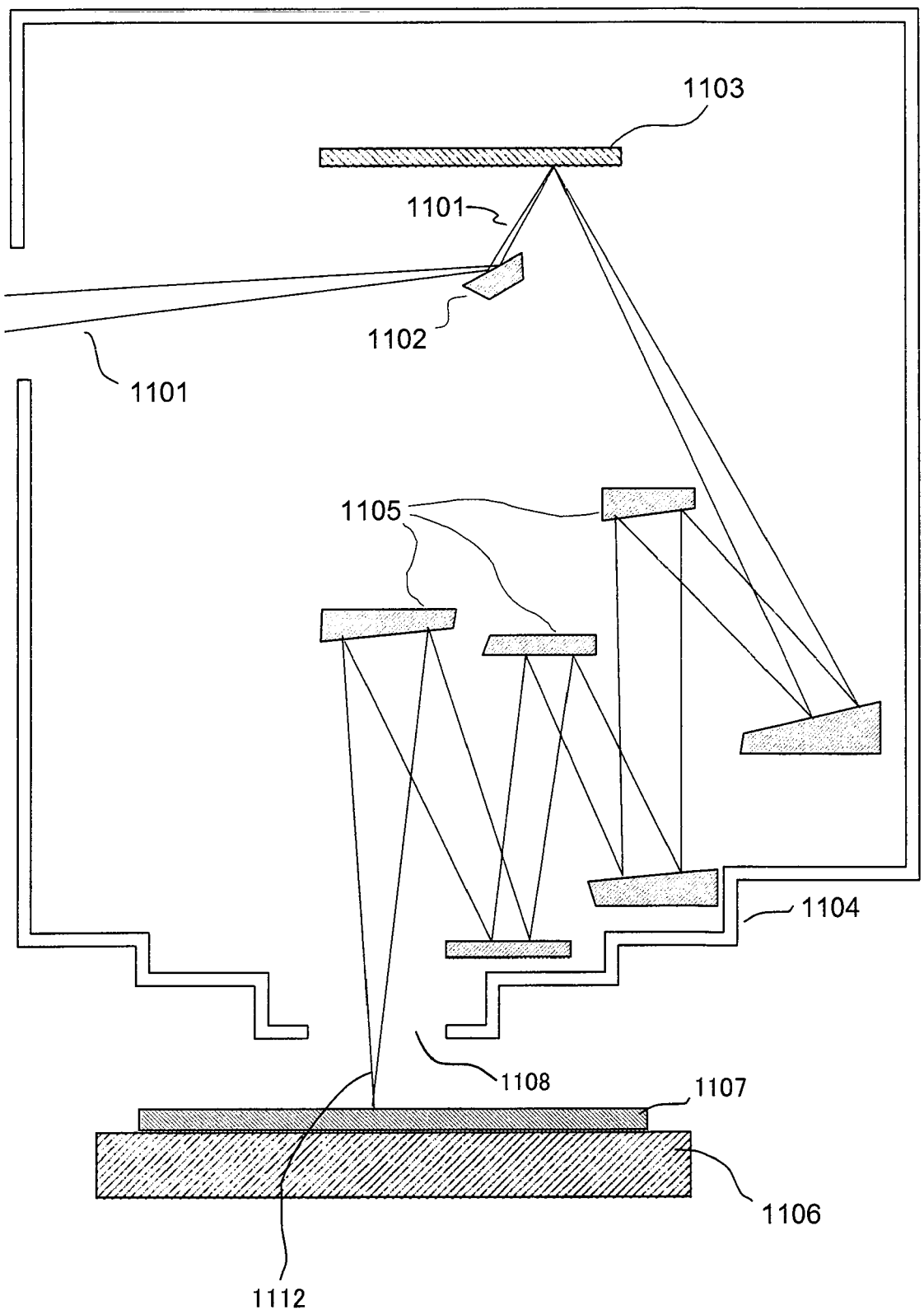
FIG. 6 is a schematic diagram of an EUV exposure apparatus.

First, a wafer having a photoresist film formed on its principal surface is prepared, and the pattern of a reflection-type mask is transferred onto the photoresist film by using the above-described EUV exposure apparatus shown in FIG. 6. Next, a failure part of the pattern transferred onto the photoresist film is extracted by, for example, wafer appearance inspection (step 1). The method for the extraction of the transfer failure part is not limited to the appearance inspection method, and for example, AIMS (Aerial Image Measurement System) may be used. The transfer failure to be extracted here is a failure caused by a defect of the reflection-type mask, and whether the failure is the failure caused by a defect of the reflection-type mask or the failure caused by wafer transfer such as a wafer process is sorted through the comparison and inspection of a plurality of shots.

Next, whether the type of the above-described transfer failure is a non-opening failure or a minute (opening) dimension failure is determined (step 2). Then, when the type of the failure is neither the non-opening failure nor the minute (opening) dimension failure, in other words, when the type of the failure is a white defect, a normal treatment for the white defect is carried out (step 4). As described above, the phase defect and the contamination defect are a kind of black defects, but the white defect is a failure caused by the crack of an absorption layer. Therefore, when the failure is a white defect, carbon, metal or the like is deposited on the cracked part of the absorption layer by a normal method, thereby carrying out the defect correction.

On the other hand, when the type of the transfer failure is the non-opening failure or the minute (opening) dimension failure, the under-exposure amount of the transfer pattern at the failure part is calculated (step 3). Examples of the calculation method of the under-exposure amount include: a method in which the amount is obtained by using an analytical curve, a table or the like based on the difference between the size of the opening in the case where transfer is carried out by an appropriate exposure amount and the size of the original opening in the case of no defect; a method in which the amount is calculated from the exposure amount at which a desired size is obtained while gradually increasing the dose in the wafer transfer; and a method in which the amount is calculated from the signal intensity of AIMS.

Next, the positions and sizes of fine auxiliary patterns (compensation patterns) to be formed in the periphery of the opening pattern in which the failure part is present are determined by calculation so as to compensate for the deficient exposure amount. Alternatively, they can be determined by referencing a table created in advance (step 5).

Figure 8A:
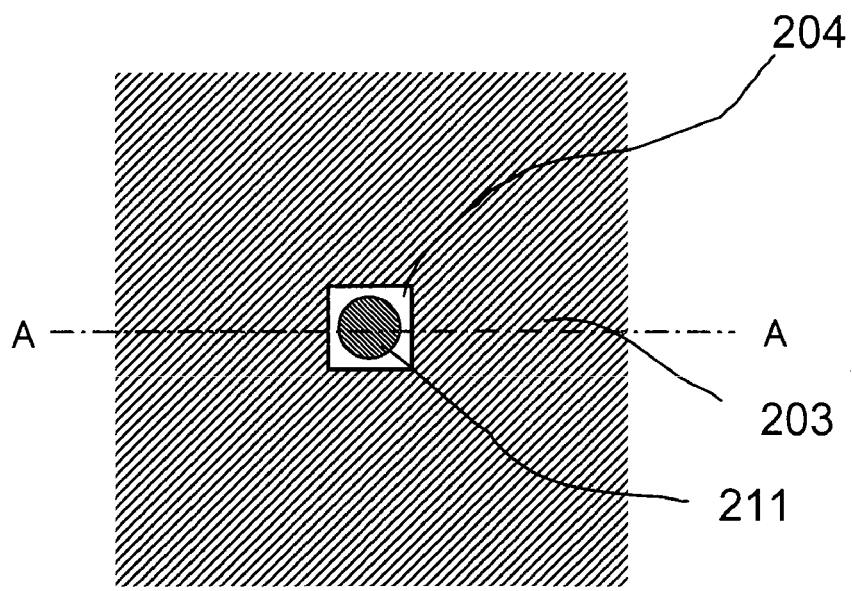
FIG. 8A is a plan view showing a substrate in the case where a phase defect is generated inside an opening pattern formed in an absorption layer of the reflection-type mask.
Figure 8B:
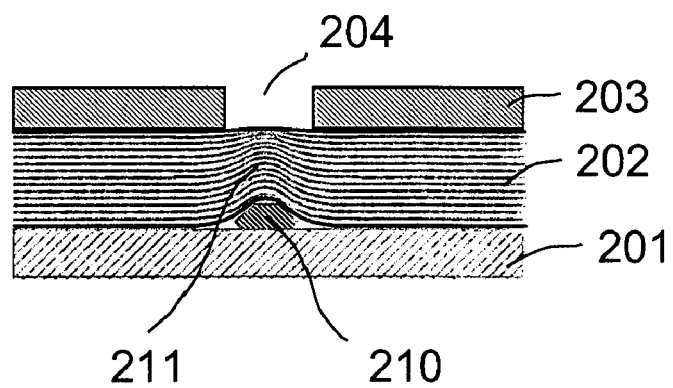
FIG. 8B is a cross sectional view of the line A-A of FIG. 8A.

FIG. 8A is a plan view showing a substrate 201 in the case where a phase defect 211 is generated inside an opening pattern 204 formed in an absorption layer 203 of a reflection-type mask, and FIG. 8B is a cross sectional view of the line A-A of FIG. 8A. Herein, the reference numeral 202 in the drawing denotes a reflective layer, and 210 denotes a particle to be a cause of the phase defect 211. The opening pattern 204 is a pattern for forming hole patterns of, for example, contact holes and through holes for interconnecting the wirings of an integrated circuit. The reflective layer 202 is made of, for example, a multilayer film obtained by stacking an Mo layer and an Si layer, and the absorption layer 203 includes a tantalum nitride (TaN) film or a chromium (Cr) film as a main constituent element thereof. The substrate 201 is made of quartz glass or low thermal expansion glass. Note that, although the case where the particle 210 to be a cause of the phase defect 211 adheres to the surface of the substrate 201 has been shown here, the particle 210 is present at an intermediate part of the reflective layer 202 in some cases. Further, there is also a case where a pit defect is generated on the substrate 201.

Figure 9A:
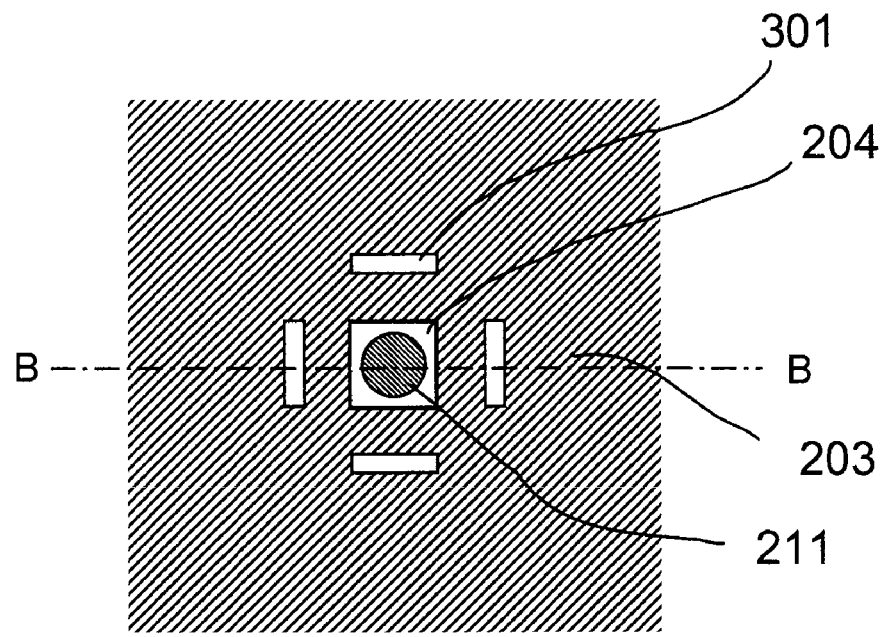
FIG. 9A is a plan view showing the defect correction method of a reflection-type mask according to an embodiment of the present invention.
Figure 9B:
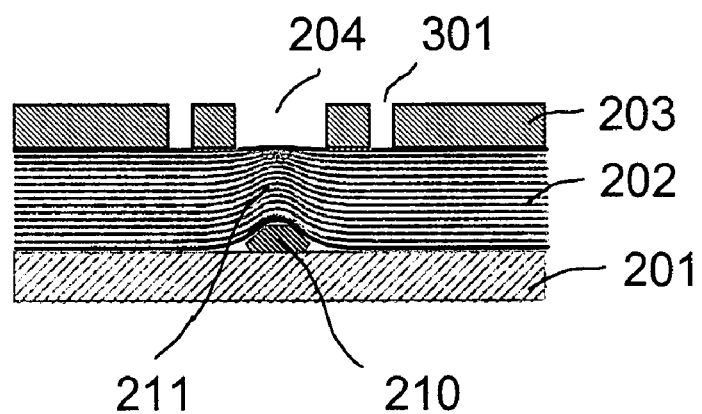
FIG. 9B is a cross sectional view of the line B-B of FIG. 9A.

When the phase defect 211 as described above is generated inside the opening pattern 204, in the present embodiment, auxiliary patterns 301 having opening diameters smaller than that of the opening pattern 204 are formed in the absorption layer 203 in the vicinity of the opening pattern 204 in which the phase defect 211 is generated (step 6) as shown in FIG. 9A and FIG. 9B (cross sectional view of the line B-B of FIG. 9A). The auxiliary patterns 301 are the patterns for adjusting the exposure light amount at the time when the opening pattern 204 is to be transferred onto the photoresist film on the wafer.

The positions for disposing the above-described auxiliary patterns 301 are changed depending on exposure conditions such as NA (Numerical Aperture) of a projection lens and coherency, characteristics of the photoresist film and others, and the patterns are disposed so that each of the patterns is away from the opening pattern by, for example, 5 nm to 10 nm in terms of dimensions on the wafer. Therefore, in the case of a 4× exposure system, each of the auxiliary patterns is disposed at a position that is away from the opening pattern 204 by about 20 nm to 40 nm on the mask. For example, in the case where four auxiliary patterns 301 are disposed in the periphery of the opening pattern 204 and the size of the opening pattern 204 and the distance from the opening pattern 204 to each of the auxiliary patterns 301 are 120 nm and 20 nm, respectively, on the mask as shown in FIG. 9A, the distance between the two auxiliary patterns 301 and 301 disposed on both sides of the opening pattern 204 is 160 nm, and the phase defect 211 having a size of this level can be comparatively readily detected in the blanks stage by a phase defect inspection apparatus. Therefore, a problem that expected exposure compensation cannot be carried out due to the phase defect 211 extended to a main part of the auxiliary pattern 301 does not occur if the phase defect inspection of this level is carried out in the blanks stage.

In the case of EUV lithography, a primary cause of the proximity effect of the transfer pattern is not the optical interference like in the optical lithography, but is a so-called blur such as acid diffusion of resist. In the case of the optical interference, the size of the opening of the auxiliary pattern exhibits a complex behavior depending on the size and positional relation of peripheral opening patterns because it is affected by complex influence of the peripheral patterns. However, in the case of the EUV lithography, the size of the opening of the auxiliary pattern 301 exhibits a simple behavior because of blur rate control. Accordingly, the characteristic obtained when the defect correction technique of the present invention is applied to EUV lithography is that a table for auxiliary patterns becomes comparatively simple.

For the formation of the auxiliary patterns 301 in the absorption layer 203, a method of, for example, scraping off the absorption layer 203 by FIB (focused ion beam), EB (electron beam) or the like, removing the absorption layer 203 by the combination of EB lithography and etching, or scraping off the absorption layer 203 by mechanical means using a needle or the like is used.

Through the processes described above, the defect correction of the reflection-type mask according to the present embodiment is completed (step 7). Even when a phase defect which cannot be readily specified by mask inspection is generated, defect correction can be readily carried out by the above-described defect correction method. Therefore, a desired transfer pattern free from defects can be formed.

The correction method of a phase defect has been described here, but a defect can be also corrected in the same manner as described above even in the case of a contamination defect. More specifically, even when a contamination film adheres to the surface of the absorption layer on the mask, since the contamination film in the region of an auxiliary pattern is scraped off when the auxiliary pattern is formed, the exposure amount can be compensated even when the state of contamination is not understood. Moreover, the above-described defect correction method of forming the auxiliary patterns in the vicinity of the opening pattern can be applied also to the case of a black defect caused by normal absorption layer remainder. This defect correction method has a characteristic that the efficiency of defect correction and defect compensation is good because defects can be recovered while omitting the labor of understanding details of the absorption layer remainder.

Also, as described above, the exposure light obliquely enters with respect to the mask in the EUV lithography, but since the absorption layer on the mask has a certain film thickness, when the exposure light enters the opening pattern or the auxiliary pattern, a shadow is formed at an end portion of the pattern. Therefore, when a plurality of auxiliary patterns are disposed in the periphery of the opening pattern, due to the relation between the incident direction of the exposure light and the directions of the auxiliary patterns, the amounts of the light reflected from the auxiliary patterns differ even when the auxiliary patterns have the same width.

Figure 10A:
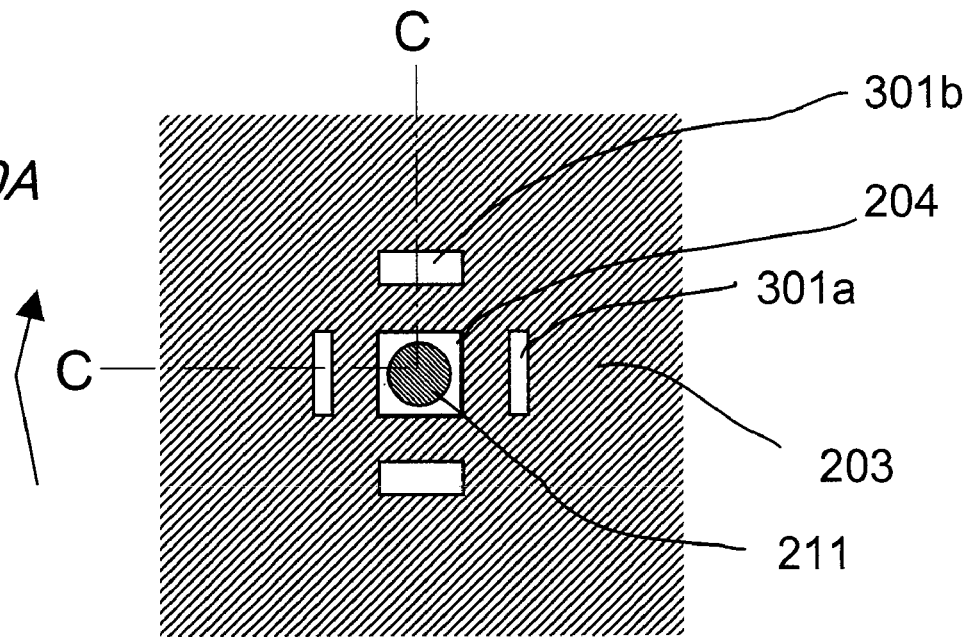
FIG. 10A is a plan view showing the defect correction method of a reflection-type mask according to an embodiment of the present invention.
Figure 10B:
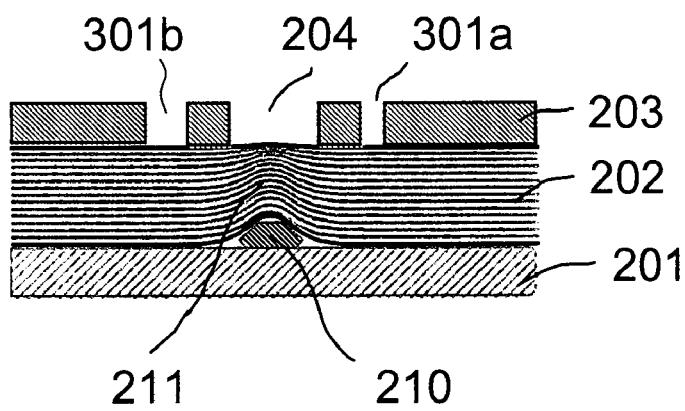
FIG. 10B is a cross sectional view of the line C-C of FIG. 10A.

For its solution, when the incident direction of the exposure light is the direction shown by an arrow in the drawing, auxiliary patterns 301a disposed in parallel to the direction may be formed to have a width different from the width of auxiliary patterns 301b disposed orthogonal to the direction as shown in FIG. 10. By doing so, the amount of the reflected light from the auxiliary patterns 301a and the amount of the reflected light from the auxiliary patterns 301b become the same, and therefore, displacement, shape deformation and others of the opening pattern transferred to the photoresist film can be prevented. Note that the difference between the width of the auxiliary patterns 301a and the width of the auxiliary patterns 301b is normally within the range of 10% to 50%, although the difference is changed depending on the size of the opening pattern, resist blur and others.

Figure 11A:
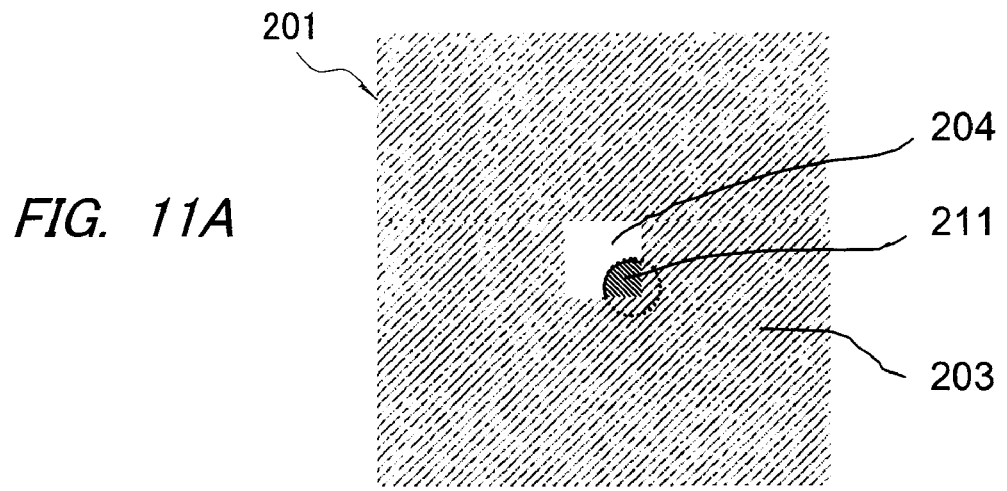
FIG. 11A is a plan view showing a substrate in the case where a phase defect is displaced from an opening pattern.
Figure 11B:
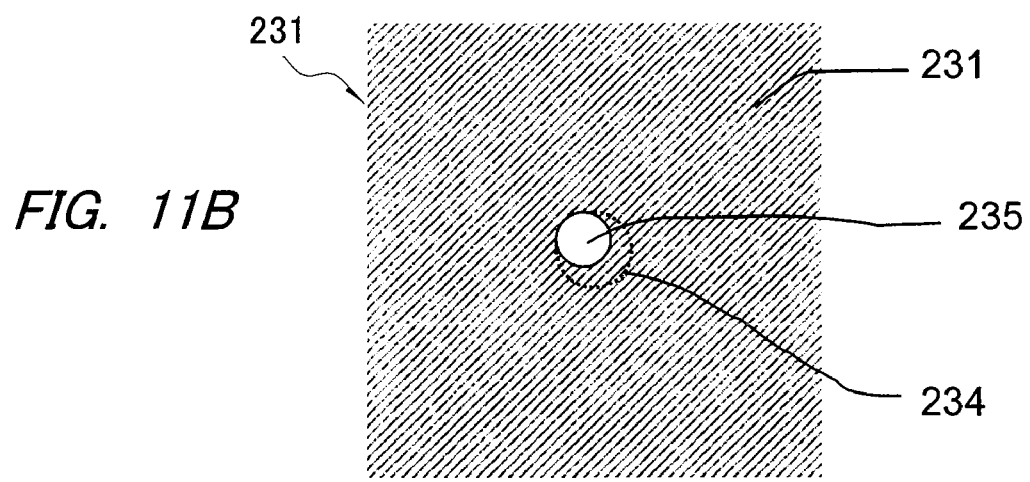
FIG. 11B is a plan view showing an image of the mask pattern shown in FIG. 11A transferred onto a photoresist film.

FIG. 11A is a plan view showing the substrate 201 in the case where the phase defect 211 is displaced from the opening pattern 204, in other words, the case where a part of the phase defect 211 is positioned inside the opening pattern 204 and the rest of the defect is positioned outside the opening pattern 204. In such a case, the image transferred to the photoresist film 231 is as shown in FIG. 11B. More specifically, a transferred pattern 235 corresponding to the opening pattern 204 of the mask is a pattern which is smaller than a transferred pattern 234 in a normal case and is displaced to a position away from the position where the phase defect 211 is present.

Figure 11C:
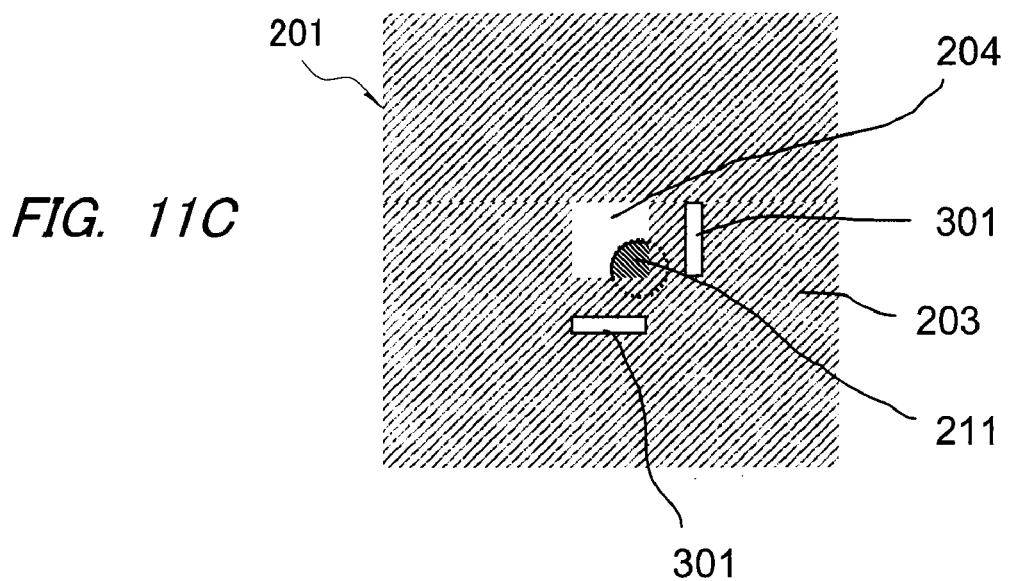
FIG. 11C is a plan view showing a defect correction method of a reflection-type mask according to an embodiment of the present invention.

When the position displacement as described above is detected by appearance inspection or the like of the photoresist film, the positions of auxiliary patterns and the size of the opening pattern on the mask are adjusted based on the displacement distance so that the center of peak intensity is located at the central position of the transferred pattern. Specifically, the auxiliary patterns 301 are disposed only in the vicinity of the phase defect 211 as shown in FIG. 11C, thereby correcting the deformation of the transferred pattern caused by the positional displacement.

In the present embodiment, the case where the present invention is applied to hole patterns in which the effects of the present invention are exerted most has been described. This is for the reasons that, in the case of hole patterns, (1) the pattern rate is small and defect correction can be efficiently carried out, and (2) although an extremely fine phase defect causes a crucial transfer defect, it is difficult to detect such a fine defect in the blanks stage or in the mask stage. However, the integrated circuit patterns to which the present invention is to be applied are not limited to the hole patterns of, for example, contact holes and through holes, but the present invention can be generally applied to fine patterns of dark fields. An example thereof will be described with reference to FIGS. 12A to 12C.

Figure 12A:
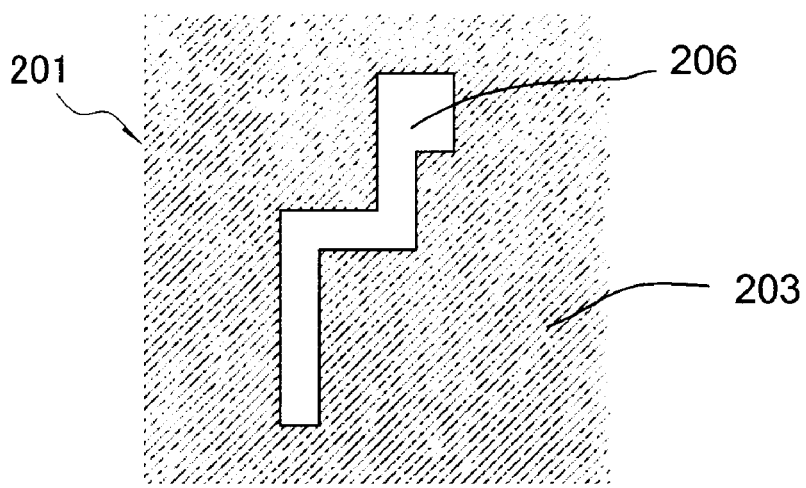
FIG. 12A is a plan view of a substrate having a groove-shaped opening pattern.
Figure 12B:
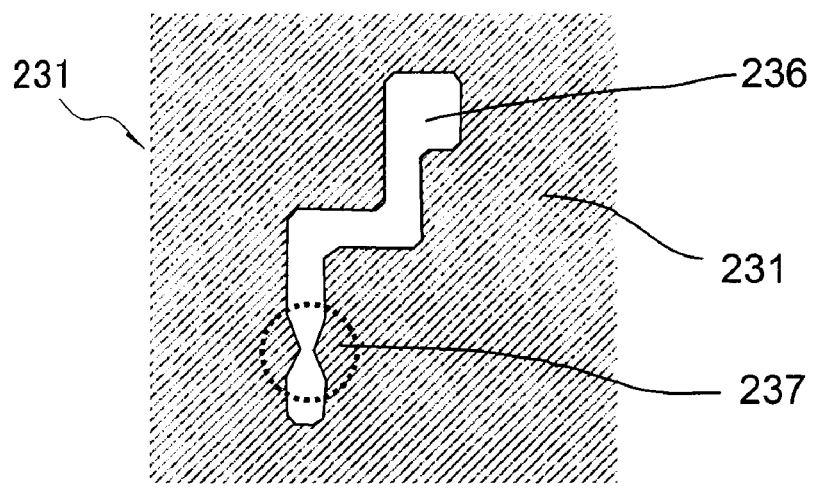
FIG. 12B is a plan view showing an image of the mask pattern shown in FIG. 12A transferred onto a photoresist film.

FIG. 12A shows a mask pattern layout in a design stage, and a reference numeral 206 in the drawing denotes a groove-shaped opening pattern. FIG. 12B shows a transferred pattern 236 in the case where the opening pattern 206 is transferred onto a photoresist film 231 on a wafer, and the part denoted by a reference numeral 237 in the drawing where the pattern width (opening width) is reduced is a transfer defect part caused by a black defect of the mask.

Figure 12C:
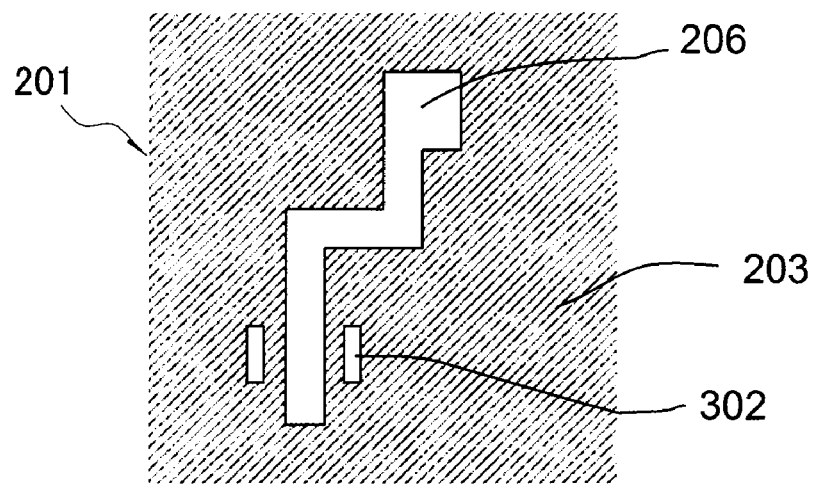
FIG. 12C is a plan view showing the defect correction method of a reflection-type mask according to an embodiment of the present invention.

When a transfer defect as described above is detected by appearance inspection or the like of the photoresist film 231, auxiliary patterns 302 are formed in the corresponding vicinity of the defect on the mask as shown in FIG. 12C. In this manner, the mask defect can be corrected not only for the hole patterns, but also for the groove-shaped opening pattern 206.

As described above, according to the above-described defect correction method of the present embodiment, defect correction can be carried out at high accuracy not only for the black defects caused by normal absorption layer remainders, but also for the phase defects and contamination defects whose detection on masks and specification of the size are difficult, and therefore, the defect-free EUV lithography can be carried out. Particularly, since minute phase defects and extremely-thin film contamination defects on the mask are problematic in the EUV lithography using a reflection-type mask, the effect of the defect correction method shown in the present embodiment is large.

Moreover, even a phase defect with an extremely fine size of about 20 nm generated in a mask causes a transfer defect in the case of hole patterns. However, it is difficult to detect the phase defect of such a size. Also, even if such a fine phase defect can be detected in a blanks stage, the probability that it becomes a crucial defect, in other words, the possibility that the defect comes in contact with an opening pattern is low in the case of the hole pattern with a small aperture ratio, and such an inspection is inefficient. Therefore, the present method which enables such a defect correction is effective for the efficient supply of defect-free masks, cost reduction and TAT reduction.

(Second Embodiment)

Figure 13A:
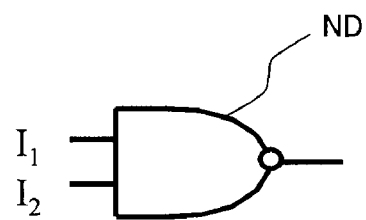
FIG. 13A is a symbol diagram of a 2-input NAND gate circuit.
Figure 13B:
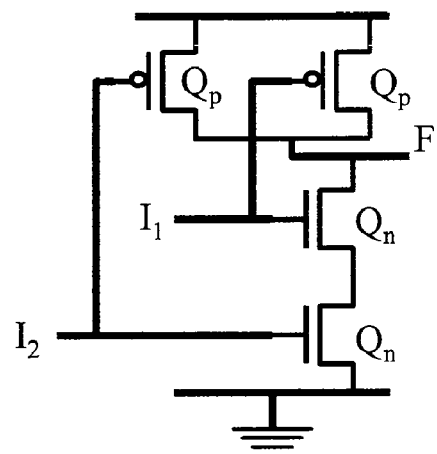
FIG. 13B is a circuit diagram of the 2-input NAND gate circuit.
Figure 13C:
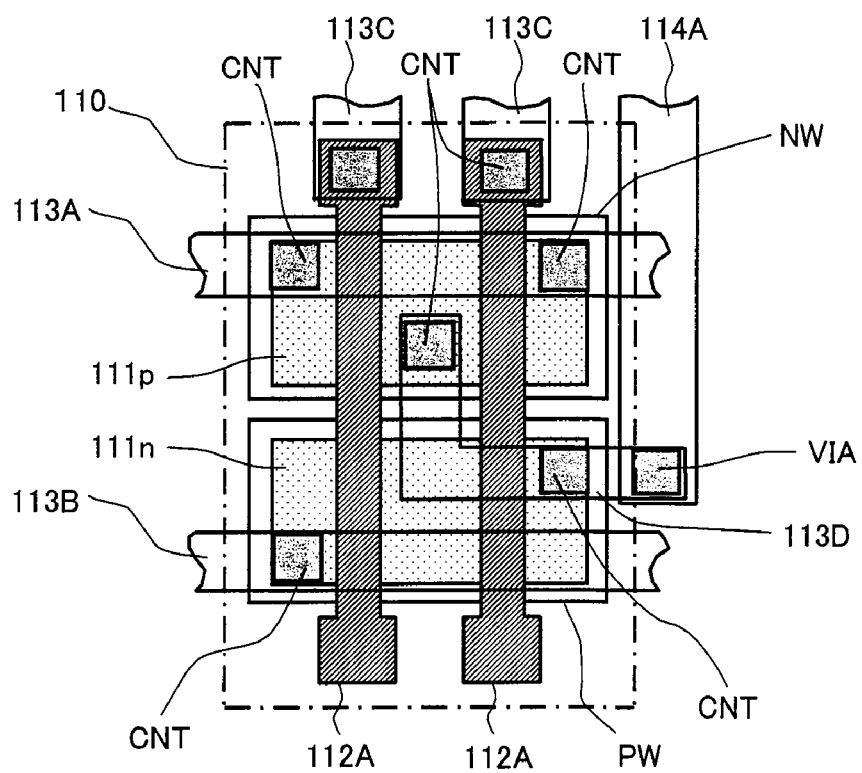
FIG. 13C is a layout plan view of the 2-input NAND gate circuit.
Figure 14A:
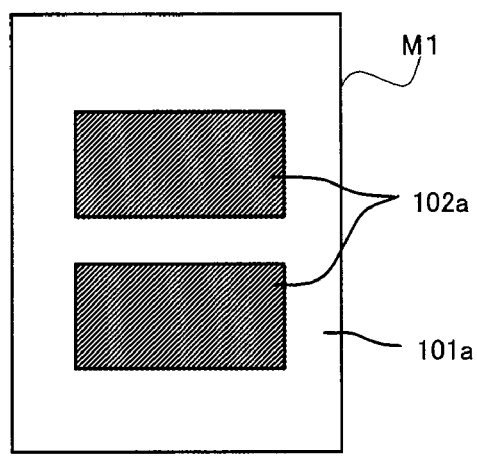
FIG. 14A is a plan view showing designed patterns of a mask used in the manufacture of the 2-input NAND gate circuit shown in FIG. 13.
Figure 14B:
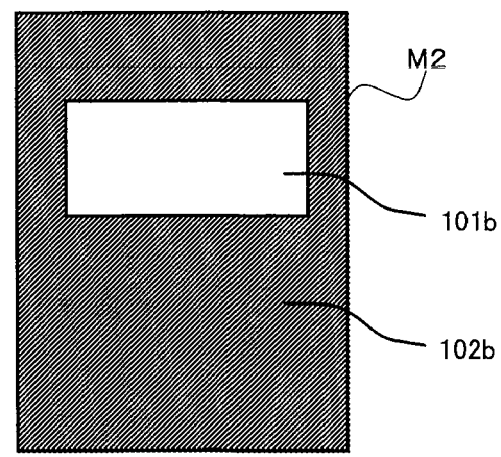
FIG. 14B is a plan view showing designed patterns of a mask used in the manufacture of the 2-input NAND gate circuit shown in FIG. 13.
Figure 14C:
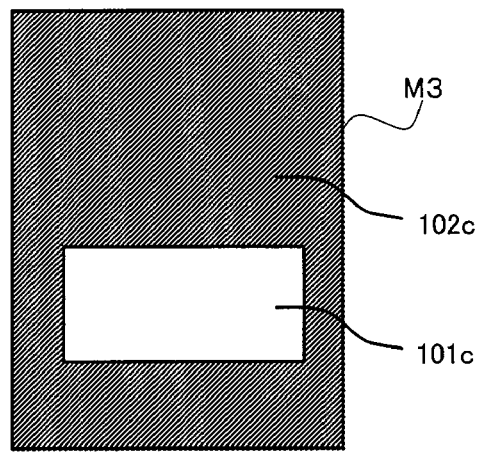
FIG. 14C is a plan view showing designed patterns of a mask used in the manufacture of the 2-input NAND gate circuit shown in FIG. 13.
Figure 14D:
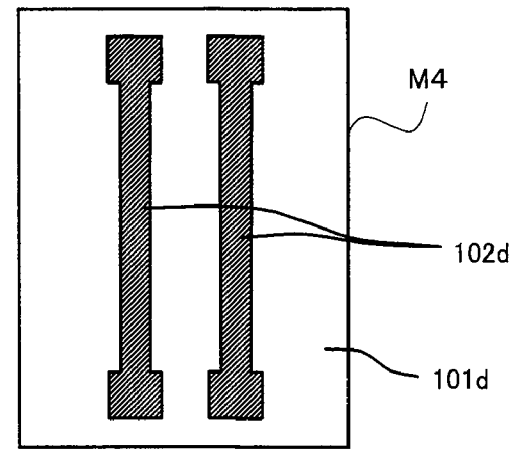
FIG. 14D is a plan view showing designed patterns of a mask used in the manufacture of the 2-input NAND gate circuit shown in FIG. 13.
Figure 14E:
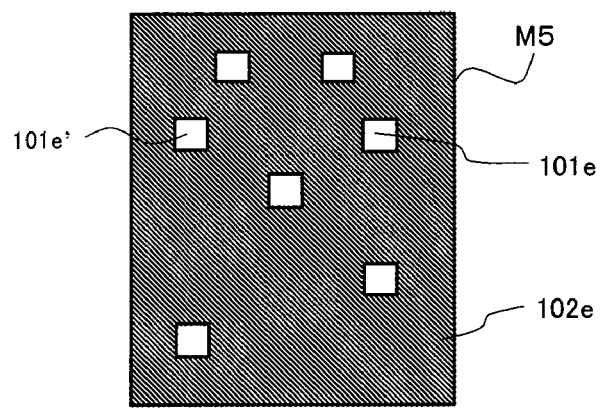
FIG. 14E is a plan view showing designed patterns of a mask used in the manufacture of the 2-input NAND gate circuit shown in FIG. 13.
Figure 14F:
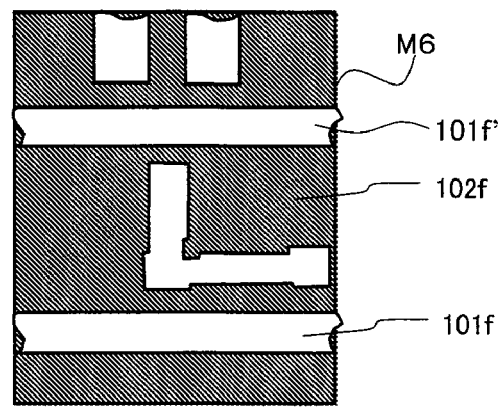
FIG. 14F is a plan view showing designed patterns of a mask used in the manufacture of the 2-input NAND gate circuit shown in FIG. 13.

In the present embodiment, an example in which the mask defect correction technique described in the first embodiment is applied to the actual manufacture of a semiconductor integrated circuit device will be described. FIGS. 13A to 13C show a 2-input NAND gate circuit ND, in which FIG. 13A shows a symbol diagram thereof, FIG. 13B shows a circuit diagram thereof, and FIG. 13C shows a layout plan view thereof, respectively. In FIG. 13C, the part surrounded by a dashed-dotted line is a unit cell 110, and the unit cell 110 is constituted of two nMOS transistors Qn formed on an $n^+$-type diffusion layer 111n of the surface of a p-type well region PW and two PMOS transistors Qp formed on a p⁺-type diffusion layer 111p of the surface of an n-type well region NW.

For the fabrication of the above-described 2-input NAND gate circuit ND, pattern transfer onto a wafer is repeated by sequentially using masks M1 to M6 as shown in FIGS. 14A to 14F and FIGS. 15A to 15F. FIGS. 14A to 14F show designed mask patterns, and FIGS. 15A to 15F show the masks fabricated based on the designed mask patterns. Among these, the masks M4 to M6 on which fine patterns which require high dimensional accuracy are formed are the masks for EUV lithography, and the case where phase defects generated in a part of the patterns are corrected by the method of the first embodiment described above is shown. On the other hand, the masks M1 to M3 on which patterns with comparatively large sizes are formed are the masks for normal photolithography.

In FIG. 14 and FIG. 15, a reference numeral 101d appended to the mask M4 denotes a reflective layer, and a reference numeral 103d denotes an absorption layer. Reference numerals 101e, 101e', 101f and 101f' appended to the masks M5 and M6 denote opening patterns formed in the reflective layer, and reference numerals 102e and 102f denote absorption layers.

Herein, the opening pattern 101e and the opening pattern 101e' of the mask M5 are hole patterns which are similar to each other. However, since a phase defect is present inside the opening pattern 101e', auxiliary patterns 103e are disposed in the periphery of the opening pattern 101e'. On the other hand, no auxiliary pattern is disposed in the periphery of the opening pattern 101e having no phase defect. Similarly, the opening pattern 101f and the opening pattern 101f' of the mask M6 are groove patterns which are similar to each other. However, since a phase defect is present inside the opening pattern 101f', auxiliary patterns 103f are disposed in the periphery of the opening pattern 101f'. On the other hand, no auxiliary pattern is disposed in the periphery of the opening pattern 101f having no phase defect.

Figure 16:
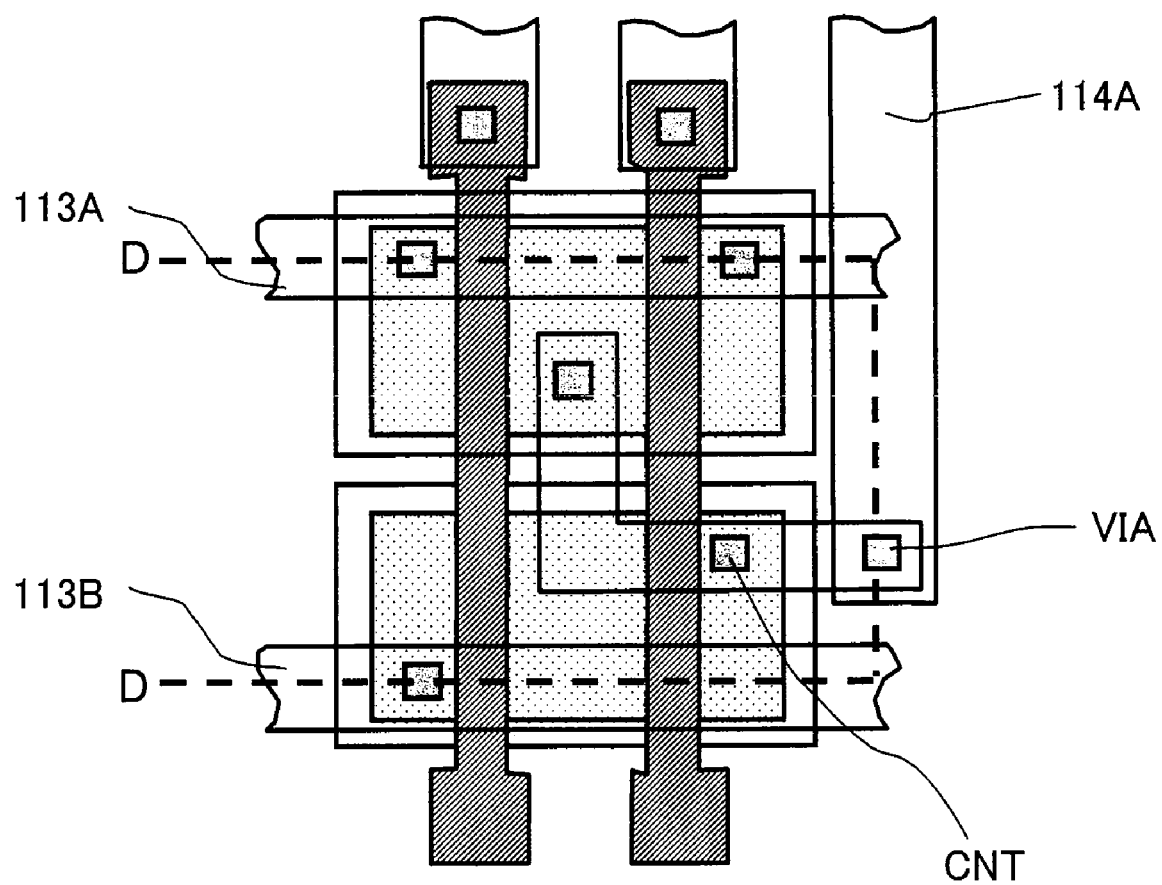
FIG. 16 is a layout plan view of the 2-input NAND gate circuit.

Hereinafter, processes carried out until the nMOS transistors Qn and the PMOS transistors Qp are formed will be described with reference to FIGS. 17A to 17E and FIGS. 18A to 18E. Note that FIGS. 17A to 17E and FIGS. 18A to 18E are cross sectional views taken along the line D-D of FIG. 16 which is a layout plan view similar to FIG. 13C.

Figure 17A:
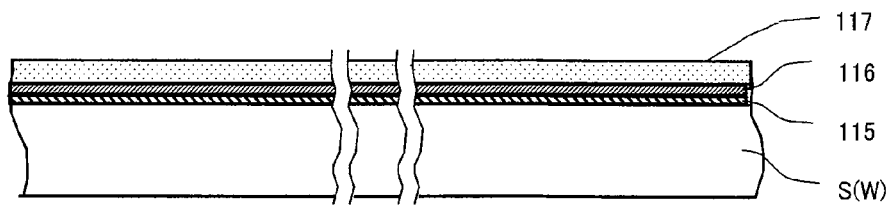
FIG. 17A is a cross sectional view of a main part of a semiconductor wafer showing a manufacturing method of the 2-input NAND gate circuit.

First, as shown in FIG. 17A, after an insulating film 115 made of, for example, silicon oxide is formed by an oxidation method on a wafer S (W) made of p-type single crystal silicon, a silicon nitride film 116 is deposited on the insulating film 115 by a CVD (Chemical Vapor Deposition) method, and then, a photoresist film 117 is formed on the silicon nitride film 116.

Figure 15A:
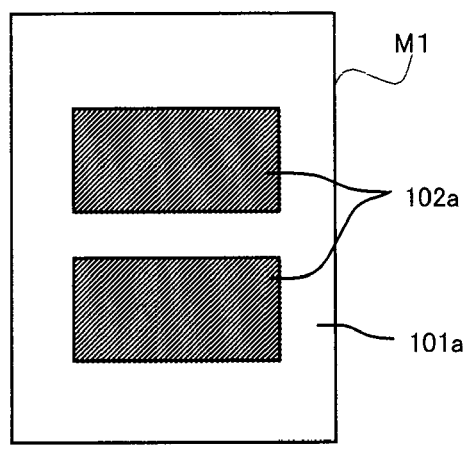
FIG. 15A is a plan view of a mask fabricated based on the designed mask patterns shown in FIG. 14.
Figure 17B:
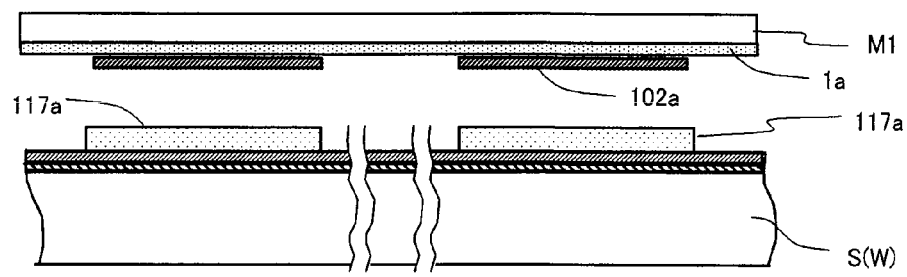
FIG. 17B is a cross sectional view of a main part of the semiconductor wafer showing a manufacturing method of the 2-input NAND gate circuit subsequent to FIG. 17A.

Next, as shown in FIG. 17B, the photoresist film 117 is subjected to an exposure/development process with using the mask M1 on which the patterns shown in FIG. 15A are formed, thereby forming a resist pattern 117a on the silicon nitride film 116.

Figure 17C:
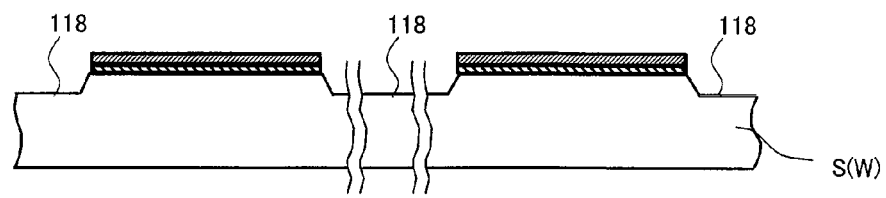
FIG. 17C is a cross sectional view of a main part of the semiconductor wafer showing a manufacturing method of the 2-input NAND gate circuit subsequent to FIG. 17B.

Next, as shown in FIG. 17C, the silicon nitride film 116 and the insulating film 115 are dry-etched with using the resist pattern 117a as a mask, and the resist pattern 117a is then removed. Subsequently, the surface of the wafer S (W) is dry-etched with using the silicon nitride film 116 as a mask, thereby forming trenches 118.

Figure 17D:
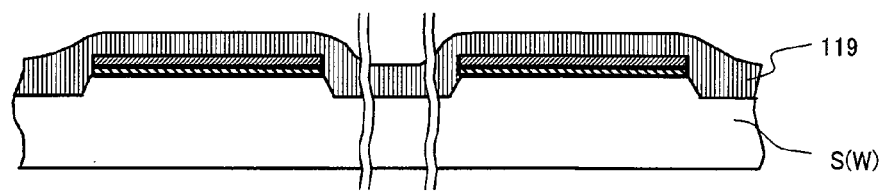
FIG. 17D is a cross sectional view of a main part of the semiconductor wafer showing a manufacturing method of the 2-input NAND gate circuit subsequent to FIG. 17C.
Figure 17E:
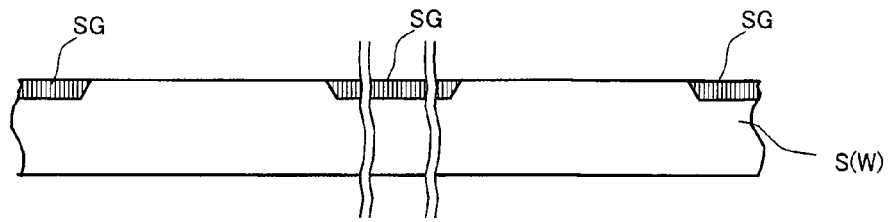
FIG. 17E is a cross sectional view of a main part of the semiconductor wafer showing a manufacturing method of the 2-input NAND gate circuit subsequent to FIG. 17D.

Next, as shown in FIG. 17D, an insulating film 119 made of, for example, silicon oxide is deposited on the wafer S (W) by the CVD method. Then, as shown in FIG. 17E, the insulating film 119 is planarized by a chemical mechanical polishing (CMP) method, and the silicon nitride film 116 and the insulating film 115 are subsequently removed, thereby forming isolation trenches SG on the surface of the wafer S (W). Herein, the isolation is carried out by the isolation trenches SG, but the isolation is not limited to this. For example, the isolation can be carried out by a field insulating film formed by the LOCOS (Local Oxidization of Silicon) method.

Figure 15B:
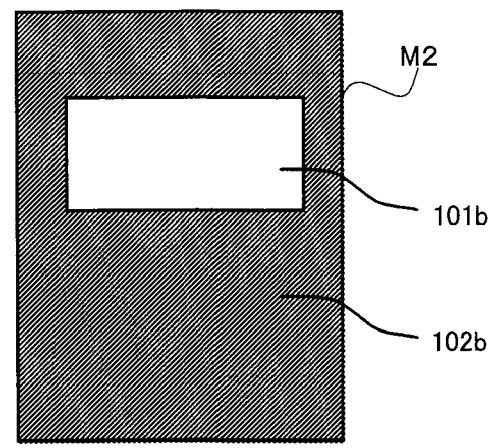
FIG. 15B is a plan view of a mask fabricated based on the designed mask patterns shown in FIG. 14.
Figure 18A:
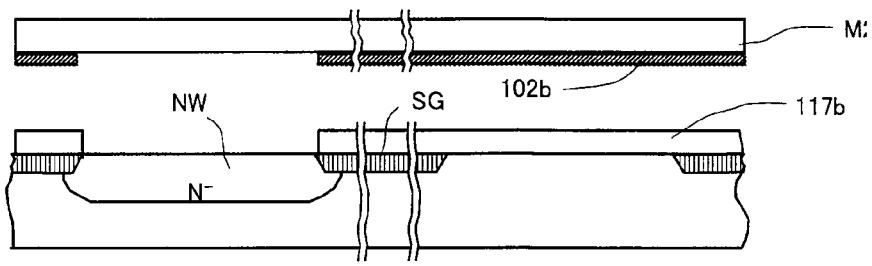
FIG. 18A is a cross sectional view of a main part of the semiconductor wafer showing the manufacturing method of the 2-input NAND gate circuit subsequent to FIG. 17E.

Next, as shown in FIG. 18A, the photoresist film formed on the wafer S (W) is subjected to an exposure/development process with using the mask M2 on which the patterns shown in FIG. 15B are formed, thereby forming a resist pattern 117b. Subsequently, phosphorous or arsenic is ion-implanted into the wafer S (W) in the region not covered with the resist pattern 117b, thereby forming an n-type well region NW.

Figure 15C:
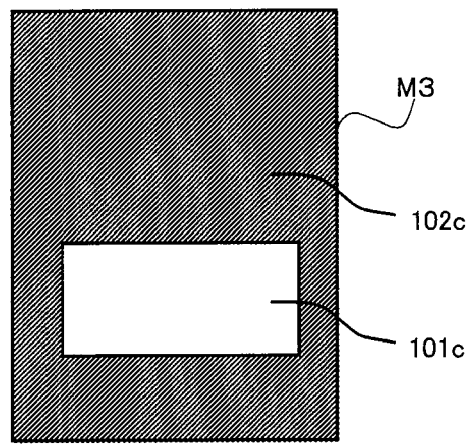
FIG. 15C is a plan view of a mask fabricated based on the designed mask patterns shown in FIG. 14.
Figure 18B:
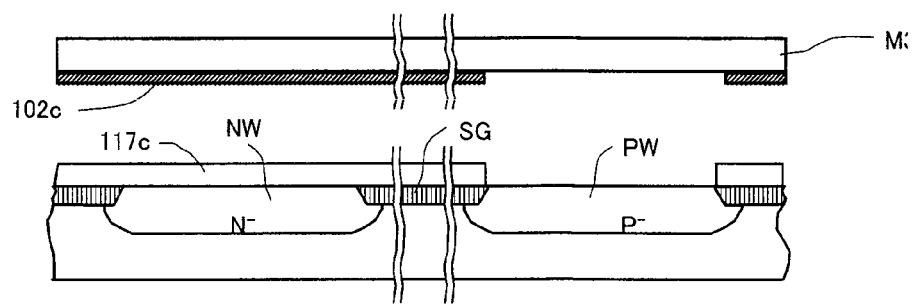
FIG. 18B is a cross sectional view of a main part of the semiconductor wafer showing the manufacturing method of the 2-input NAND gate circuit subsequent to FIG. 18A.

Next, after the resist pattern 117b is removed, as shown in FIG. 18B, the photoresist film formed on the wafer S (W) is subjected to an exposure/development process with using the mask M3 on which the patterns shown in FIG. 15C are formed, thereby forming a resist pattern 117c. Subsequently, boron is ion-implanted into the wafer S (W) in the region not covered with the resist pattern 117c, thereby forming a p-type well region PW.

Figure 18C:
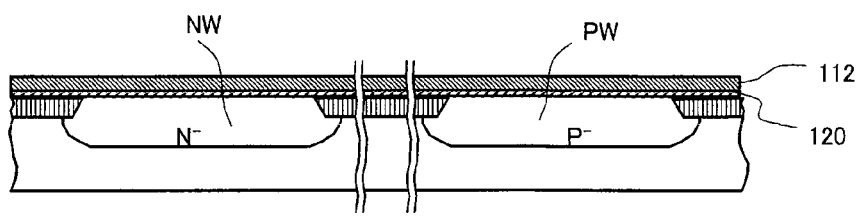
FIG. 18C is a cross sectional view of a main part of the semiconductor wafer showing the manufacturing method of the 2-input NAND gate circuit subsequent to FIG. 18B.

Next, as shown in FIG. 18C, after a gate insulating film 120 which is made of, for example, silicon oxide and has a film thickness of about 2 nm is formed on the surface of the wafer S (W), a conductive film 112 constituted of a stacked film of a polycrystalline silicon film and a tungsten film is deposited on the gate insulating film 120 by the CVD method.

Figure 15D:
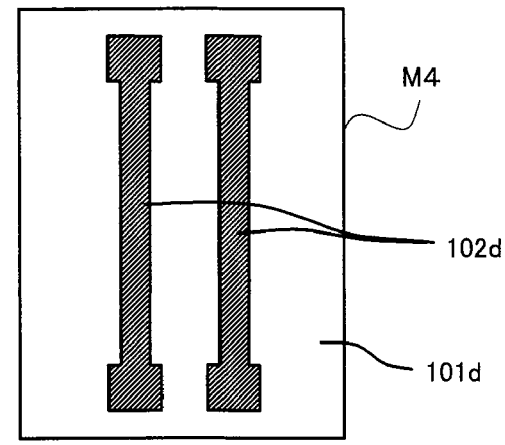
FIG. 15D is a plan view of a mask fabricated based on the designed mask patterns shown in FIG. 14.
Figure 15E:
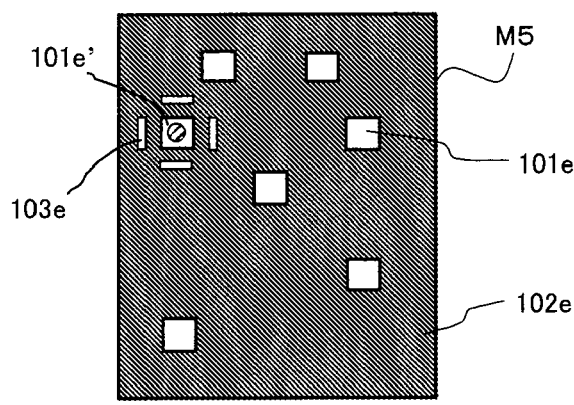
FIG. 15E is a plan view of a mask fabricated based on the designed mask patterns shown in FIG. 14.
Figure 15F:
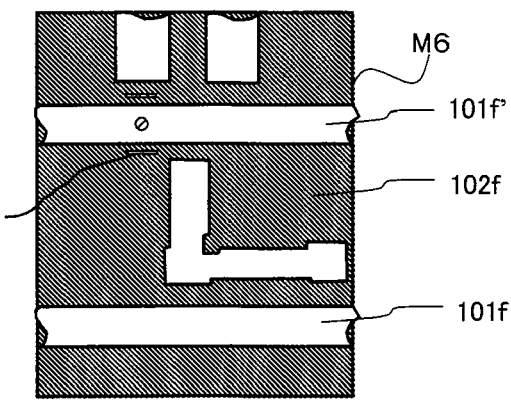
FIG. 15F is a plan view of a mask fabricated based on the designed mask patterns shown in FIG. 14.
Figure 18D:
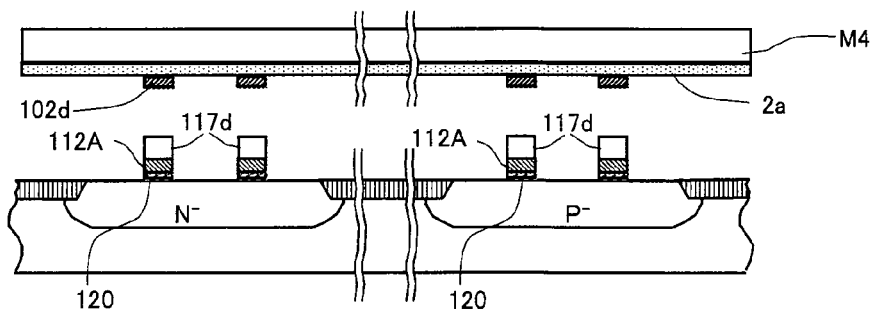
FIG. 18D is a cross sectional view of a main part of the semiconductor wafer showing the manufacturing method of the 2-input NAND gate circuit subsequent to FIG. 18C.

Next, as shown in FIG. 18D, the mask M4 on which the patterns shown in FIG. 15D are formed is prepared, and a photoresist film formed on the conductive film 112 is subjected to an exposure/development process, thereby forming a resist pattern 117d. Subsequently, the conductive film 112 and the gate insulating film 120 are dry-etched with using the resist pattern 117d as a mask, thereby forming gate electrodes 112A of the nMOS transistors Qn and forming gate electrodes 112A of the PMOS transistors Qp.

Figure 18E:
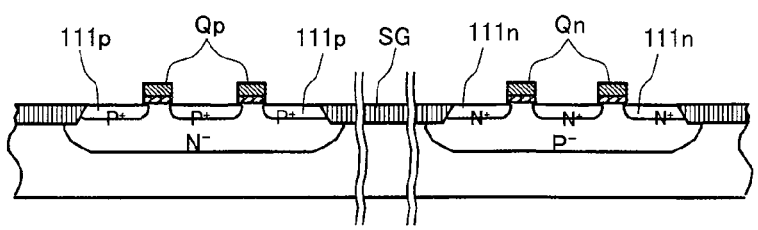
FIG. 18E is a cross sectional view of a main part of the semiconductor wafer showing the manufacturing method of the 2-input NAND gate circuit subsequent to FIG. 18D.

Next, as shown in FIG. 18E, phosphorous or arsenic is ion-implanted into the p-type well region PW, thereby forming n⁺-type diffusion layers 111n which constitute the sources and drains of the n-MOS transistors Qn. Also, boron is ion-implanted into the n-type well region NW, thereby forming p⁺-type diffusion layers 111p which constitute the sources and drains of the PMOS transistors Qp. The NMOS transistors Qn and the PMOS transistors Qp are completed through the processes above.

Next, a wiring formation process will be described with reference to FIGS. 19A to 19F. FIGS. 19A to 19F are cross sectional views taken along the line D-D of FIG. 16 like FIGS. 17A to 17E and FIGS. 18A to 18E.

Figure 19A:
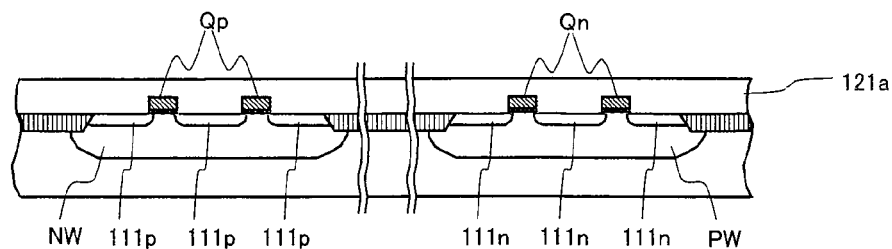
FIG. 19A is a cross sectional view of a main part of the semiconductor wafer showing the manufacturing method of the 2-input NAND gate circuit subsequent to FIG. 18E.

First, as shown in FIG. 19A, after an interlayer insulating film 121a made of, for example, silicon oxide is deposited on the nMOS transistors Qn and the PMOS transistors Qp by the CVD method, a photoresist film (not shown) is applied onto the interlayer insulating film 121a.

Figure 19B:
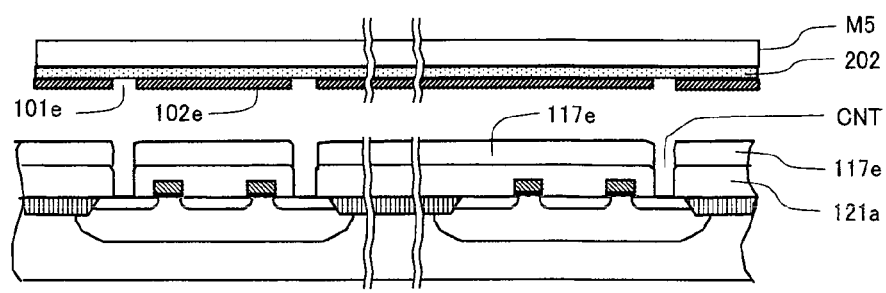
FIG. 19B is a cross sectional view of a main part of the semiconductor wafer showing the manufacturing method of the 2-input NAND gate circuit subsequent to FIG. 19A.

Next, as shown in FIG. 19B, the mask M5 is prepared, and the photoresist film on the interlayer insulating film 121a is subjected to an exposure/development process, thereby forming a resist pattern 117e. The mask M5 used herein is the mask shown in FIG. 15E, in which the opening patterns 101e are formed in the absorption layer 102e on the reflective layer 202.

Subsequently, the interlayer insulating film 121a is dry-etched with using the resist pattern 117e as a mask, thereby forming contact holes CNT above the n⁺-type diffusion layer 111n and the p⁺-type diffusion layer 111p.

Figure 19C:
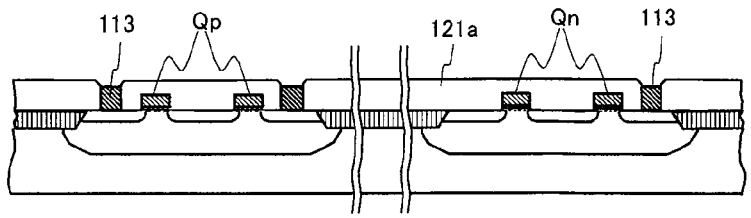
FIG. 19C is a cross sectional view of a main part of the semiconductor wafer showing the manufacturing method of the 2-input NAND gate circuit subsequent to FIG. 19B.

Next, the resist pattern 117e is removed. Then, as shown in FIG. 19C, a metal film of, for example, tungsten (W), tungsten alloy or copper (Cu) is buried in the contact holes CNT, and subsequently, the surface of the metal film is planarized by the CMP method, thereby forming metal plugs 113 in the contact holes CNT.

Figure 19D:
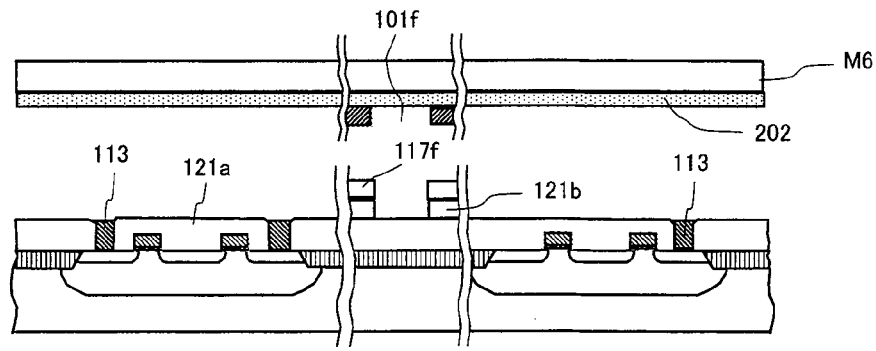
FIG. 19D is a cross sectional view of a main part of the semiconductor wafer showing the manufacturing method of the 2-input NAND gate circuit subsequent to FIG. 19C.

Next, as shown in FIG. 19D, an interlayer insulating film 121b made of, for example, silicon oxide is deposited on the interlayer insulating film 121a by the CVD method, and a photoresist film (not shown) is then applied onto the interlayer insulating film 121b. Subsequently, the mask M6 is prepared, and the photoresist film on the interlayer insulating film 121b is subjected to an exposure/development process, thereby forming a resist pattern 117f. The mask M6 used herein is the mask shown in FIG. 15F, in which the opening patterns 101f are formed in the absorption layer 102f on the reflective layer 202. Next, the interlayer insulating film 121b is dry-etched with using the resist pattern 117f as a mask.

Figure 19E:
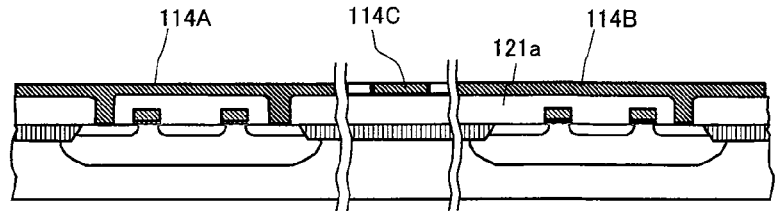
FIG. 19E is a cross sectional view of a main part of the semiconductor wafer showing the manufacturing method of the 2-input NAND gate circuit subsequent to FIG. 19D.

Next, the resist pattern 117f is removed. Then, as shown in FIG. 19E, a metal film of, for example, copper is deposited by a sputtering method, and subsequently, the surface of the metal film is planarized by the CMP method, thereby forming wirings 114A, 114B and 114C.

Figure 19F:
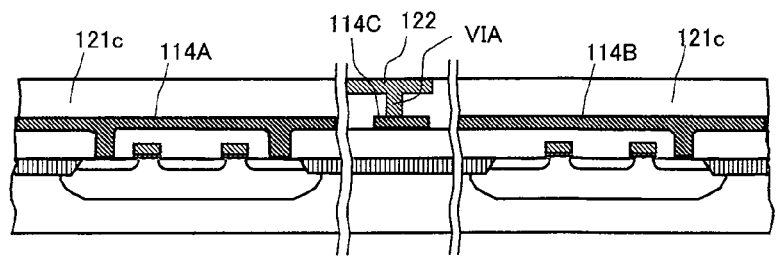
FIG. 19F is a cross sectional view of a main part of the semiconductor wafer showing the manufacturing method of the 2-input NAND gate circuit subsequent to FIG. 19E.

Next, as shown in FIG. 19F, an interlayer insulating film 121c made of, for example, silicon oxide is deposited on the wirings 114A, 114B and 114C by the CVD method, and a through hole VIA is then formed in the interlayer insulating film 121c on the wiring 114C with using a mask for EUV lithography (not shown). Then, a second-layer wiring 122 connected to the wiring 114C via the through hole VIA is formed, thereby completing the 2-input NAND gate. Note that it goes without saying that other circuits such as a NOR gate circuit and others can be formed by changing the shapes and positions of the opening patterns 101e and 101f formed on the masks M5 and M6.

Among the masks M4 to M6 for EUV lithography used in the above-described manufacturing processes, dark field masks (M5 and M6) in which the absorption layers 102e and 102f are formed in the field part are the masks to which the defect correction method of the first embodiment described above is applied. On the other hand, with respect to the mask M4 which is a bright field mask, phase defect inspection is elaborately carried out in the blanks stage, and only the blanks having no defect are sent to the mask manufacturing processes.

In the mask M5 on which the opening patterns 101e for the contact holes are formed, defect-free blanks sorting in the blanks stage cannot be carried out because a fine phase defect that cannot be detected even by an actinic phase defect inspection apparatus causes a transfer defect. For example, even when a fine phase defect having a height of 2 nm and a width of about 20 nm is generated on the mask, formation accuracy of a contact hole is adversely affected, but it is impossible to detect the defect having such a size. However, when the defect correction method of the first embodiment described above is applied, defects can be recovered even in the mask M5 in which such a fine phase defect is generated. Moreover, by obtaining the mask defect compensation amount in the single transfer evaluation and forming auxiliary patterns in accordance with a guideline, defects can be recovered.

Also, in the case of the mask M6 on which the opening patterns 101f for wiring are formed, phase defects on the mask which may cause the transfer defects can be detected if elaborately carrying out the inspection by using the actinic phase defect inspection apparatus, and if such elaborate inspection sorting is carried out in the blanks stage, defect-free masks can be obtained. However, the masks thus obtained will be expensive masks that cost a lot. Furthermore, since even the masks having phase defects located at the positions that do not lead to the transfer defects are to be discarded, sorting efficiency in the blanks stage is lowered. However, by using the mask M6 to which the defect correction method of the first embodiment described above is applied, such problems can be solved.

In the foregoing, the invention made by the inventor of the present invention has been concretely described based on the embodiments. However, it is needless to say that the present invention is not limited to the foregoing embodiments and various modifications and alterations can be made within the scope of the present invention.

The present invention can be applied to the defect correction of a reflection-type mask for EUV lithography.

What is claimed is:

1. A manufacturing method of a semiconductor integrated circuit device comprising the steps of:
    (a) preparing a semiconductor wafer having a photoresist film formed on its principal surface;
    (b) disposing the semiconductor wafer on a wafer stage of a projection exposure system having a reflection-type optical system;
    (c) supplying a reflection-type mask having a first pattern and a second pattern at a predetermined position of the projection exposure system, the first pattern being formed by a reflective layer which reflects light of a predetermined wavelength and an absorption layer which is formed on the reflective layer and absorbs the light of the predetermined wavelength, and the second pattern being formed by the reflective layer which reflects the light of the predetermined wavelength and the absorption layer which is formed on the reflective layer and absorbs the light of the predetermined wavelength; and
    (d) exposing the photoresist film of the semiconductor wafer to the light of the predetermined wavelength based on the first and second patterns of the reflection-type mask,
    wherein the absorption layer which forms the first pattern of the reflection-type mask includes: a first opening pattern which exposes the reflective layer and corresponds to the first pattern; and an auxiliary pattern which is formed in a periphery of the first opening pattern, has an opening different from the first opening pattern, and which itself is not transferred,
    the absorption layer which forms the second pattern of the reflection-type mask includes: a second opening pattern which exposes the reflective layer and corresponds to the second pattern; and no auxiliary pattern which is different from the second opening pattern and formed in a periphery of the second opening pattern, and
    the first pattern and the second pattern are patterns which are similar to each other.

2. The manufacturing method of a semiconductor integrated circuit device according to claim 1,
    wherein the auxiliary pattern of the reflection-type mask is a pattern for adjusting a light amount for exposing the photoresist film to a predetermined pattern.

3. The manufacturing method of a semiconductor integrated circuit device according to claim 2,
    wherein the light of the predetermined wavelength is extreme ultraviolet (EUV) light.

4. The manufacturing method of a semiconductor integrated circuit device according to claim 3,
    wherein a main constituent element of the reflective layer of the reflection-type mask is a multilayer film of a molybdenum (Mo) layer and a silicon (Si) layer, and the absorption layer of the reflection-type mask contains a tantalum nitride (TaN) film or a chromium (Cr) film as a constituent element.

5. The manufacturing method of a semiconductor integrated circuit device according to claim 1,
wherein a plurality of auxiliary patterns are provided in the periphery of the first opening pattern, and among the plurality of auxiliary patterns, a width of the auxiliary pattern extending in a direction parallel to a direction of the light of the predetermined wavelength is different from a width of the auxiliary pattern extending in a direction orthogonal to the direction of the light of the predetermined wavelength.

6. A manufacturing method of a semiconductor integrated circuit device comprising the steps of:
(a) preparing a semiconductor wafer having a photoresist film formed on its principal surface;
(b) disposing the semiconductor wafer on a wafer stage of a projection exposure system having a reflection-type optical system;
(c) supplying a reflection-type mask having an opening pattern at a predetermined position of the projection exposure system, the opening pattern being formed by a reflective layer which reflects light of a predetermined wavelength and an absorption layer which is formed on the reflective layer and absorbs the light of the predetermined wavelength;
(d) exposing the photoresist film of the semiconductor wafer to the light of the predetermined wavelength based on the opening pattern of the reflection-type mask;
(e) extracting a failure position of the opening pattern transferred to the photoresist film after the step (d); and
(f) forming an auxiliary pattern having an opening diameter finer than the opening pattern in the absorption layer in a vicinity of the opening pattern when a type of the failure extracted in the step (e) is a non-opening failure or a minute opening dimension failure of the opening pattern, wherein the auxiliary pattern itself is not transferred.

7. The manufacturing method of a semiconductor integrated circuit device according to claim 6,
wherein the light of the predetermined wavelength is extreme ultraviolet light.

8. The manufacturing method of a semiconductor integrated circuit device according to claim 7,
wherein the wavelength of the extreme ultraviolet light is 13.5 nm.

9. The manufacturing method of a semiconductor integrated circuit device according to claim 6,
wherein a main constituent element of the reflective layer of the reflection-type mask is a multilayer film of a molybdenum layer and a silicon layer, and the absorption layer of the reflection-type mask contains a tantalum nitride film or a chromium film as a constituent element.

10. The manufacturing method of a semiconductor integrated circuit device according to claim 6,
wherein the failure of the opening pattern is a phase defect, a contamination defect or a black defect.

11. The manufacturing method of a semiconductor integrated circuit device according to claim 6,
wherein the opening pattern is a hole pattern.

12. The manufacturing method of a semiconductor integrated circuit device according to claim 6,
wherein the opening pattern is a groove pattern.

* * * * *